(12) United States Patent
Choi et al.

(10) Patent No.: US 11,996,369 B2
(45) Date of Patent: *May 28, 2024

(54) SEMICONDUCTOR DEVICES AND METHODS OF MANUFACTURING SEMICONDUCTOR DEVICES

(71) Applicant: Amkor Technology Singapore Holding Pte. Ltd., Singapore (SG)

(72) Inventors: Myung Jea Choi, Incheon (KR); Gyu Wan Han, Incheon (KR); Gi Tae Lim, Incheon (KR); Dong Joo Park, Incheon (KR); Ji Hun Yi, Incheon (KR); Jin Young Khim, Seoul (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 17/973,057

(22) Filed: Oct. 25, 2022

(65) Prior Publication Data

US 2023/0110213 A1 Apr. 13, 2023

Related U.S. Application Data

(63) Continuation of application No. 17/073,025, filed on Oct. 16, 2020, now Pat. No. 11,482,496.

(51) Int. Cl.
*H01L 23/538* (2006.01)
*H01L 21/48* (2006.01)
(Continued)

(52) U.S. Cl.
CPC ...... *H01L 23/5389* (2013.01); *H01L 21/4853* (2013.01); *H01L 21/4857* (2013.01);
(Continued)

(58) Field of Classification Search
CPC ............. H01L 23/5389; H01L 21/4853; H01L 21/4857; H01L 21/565; H01L 23/3128;
(Continued)

(56) References Cited

U.S. PATENT DOCUMENTS 11,482,496 B2 * 10/2022 Choi ....................... H01L 24/19
2017/0069607 A1 3/2017 Yap
(Continued)

*Primary Examiner* — Fernando L Toledo
*Assistant Examiner* — Neil R Prasad
(74) *Attorney, Agent, or Firm* — Spectrum IP Law Group LLC

(57) ABSTRACT

In one example, an electronic device, comprises a first substrate comprising a first conductive structure, a second substrate comprising a second conductive structure, wherein the first substrate is over the second substrate, a first electronic component between the first substrate and the second substrate, a vertical interconnect between the first substrate and the second substrate, wherein the vertical interconnect is coupled with the first conductive structure and the second conductive structure, and an encapsulant between the first substrate and the second substrate and covering the vertical interconnect. A vertical port on the first electronic component is exposed by an aperture of the first substrate. Other examples and related methods are also disclosed herein.

20 Claims, 22 Drawing Sheets

(51) Int. Cl.
    *H01L 21/56*     (2006.01)
    *H01L 23/00*     (2006.01)
    *H01L 23/31*     (2006.01)

(52) U.S. Cl.
    CPC ........ *H01L 21/565* (2013.01); *H01L 23/3128* (2013.01); *H01L 23/5383* (2013.01); *H01L 23/5385* (2013.01); *H01L 23/5386* (2013.01); *H01L 24/19* (2013.01); *H01L 24/20* (2013.01); *H01L 2224/214* (2013.01)

(58) Field of Classification Search
    CPC ............. H01L 23/5383; H01L 23/5385; H01L 23/5386; H01L 24/19; H01L 24/20; H01L 2224/214
    See application file for complete search history.

(56) References Cited

U.S. PATENT DOCUMENTS

| | | |
|---|---|---|
| 2018/0152657 A1 | 5/2018 | Miyazawa |
| 2019/0103386 A1 | 4/2019 | Chen et al. |
| 2020/0003975 A1 | 1/2020 | Yu et al. |
| 2021/0091056 A1 | 3/2021 | Yu et al. |
| 2021/0096310 A1 | 4/2021 | Chang et al. |
| 2021/0096311 A1 | 4/2021 | Yu et al. |

\* cited by examiner

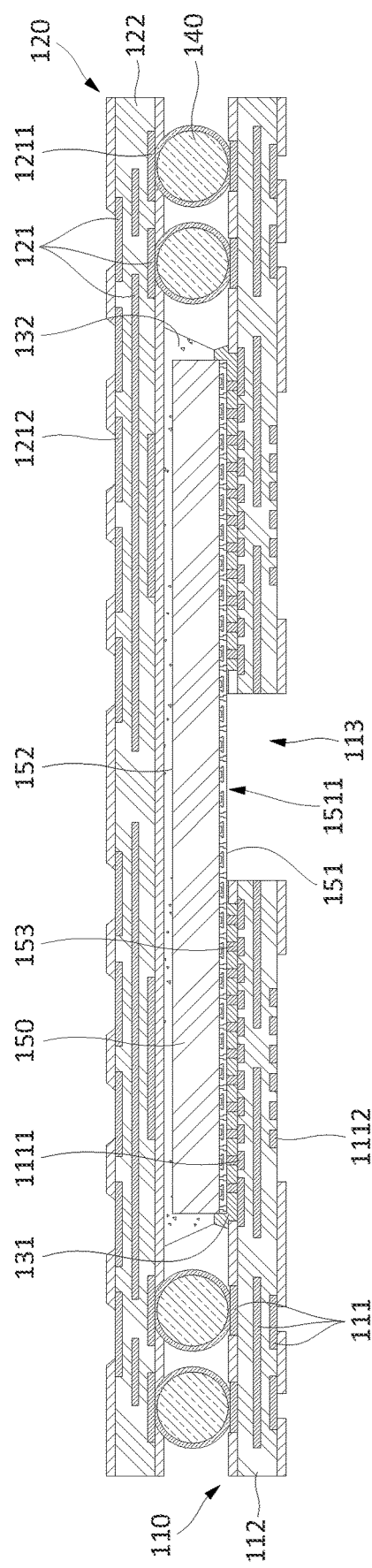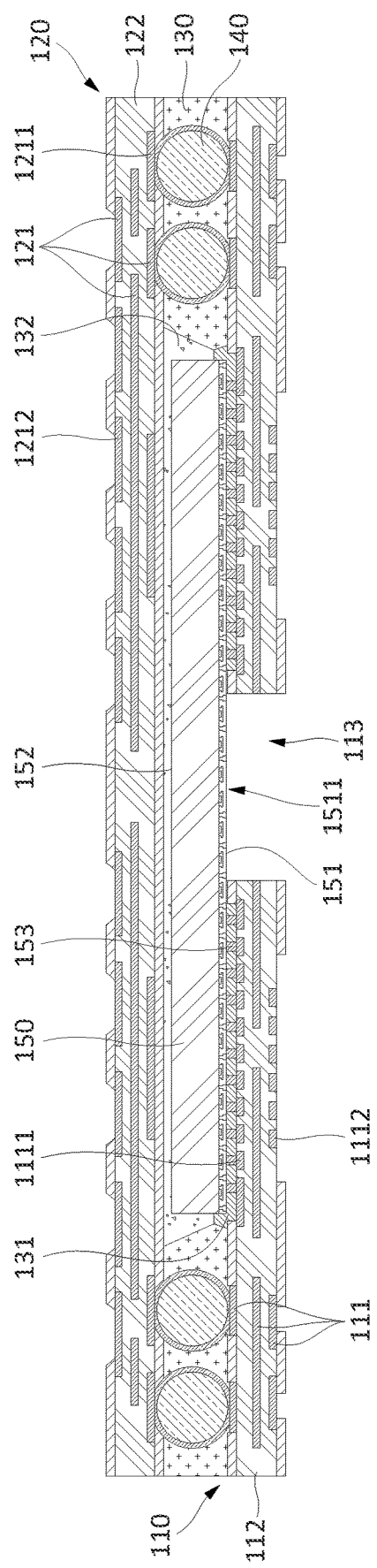
FIG.2C
FIG.2D

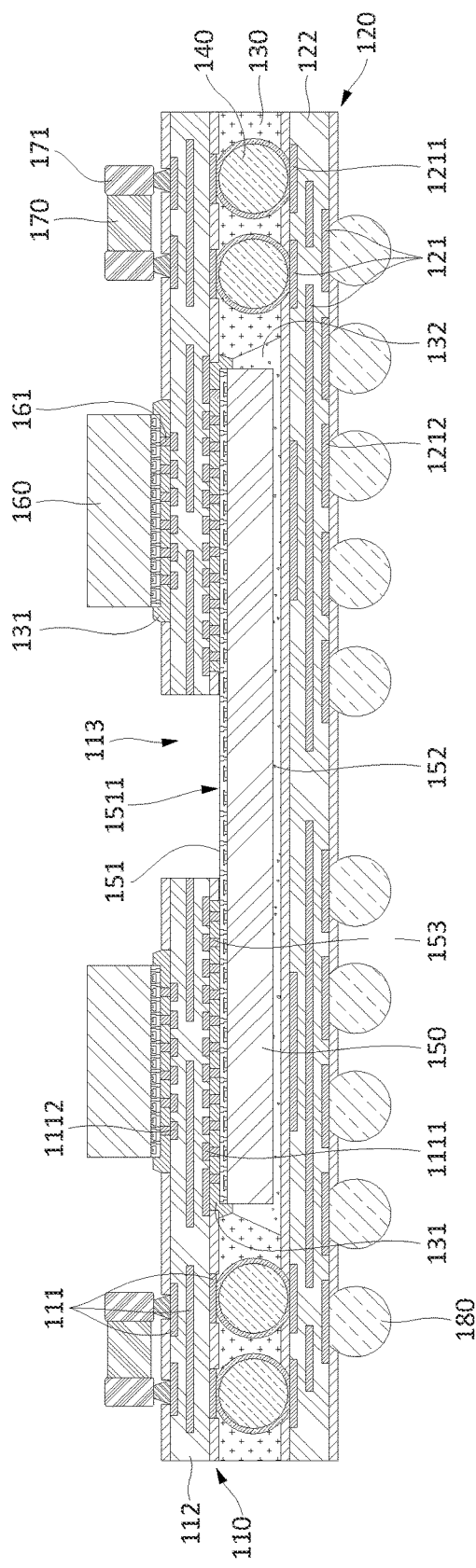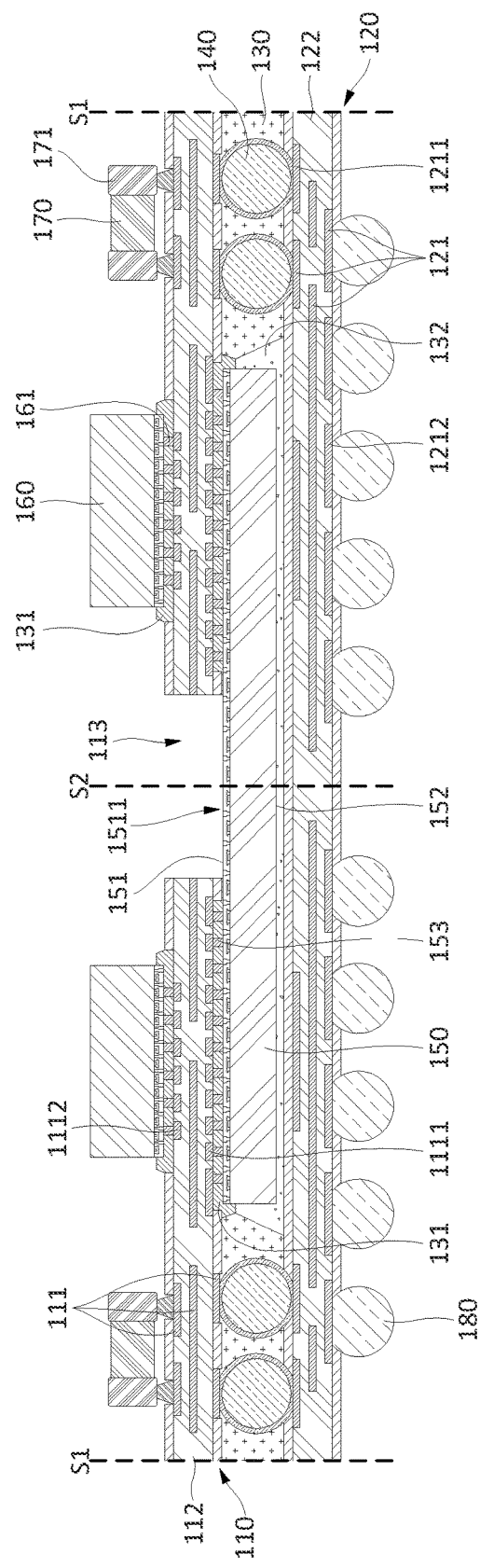

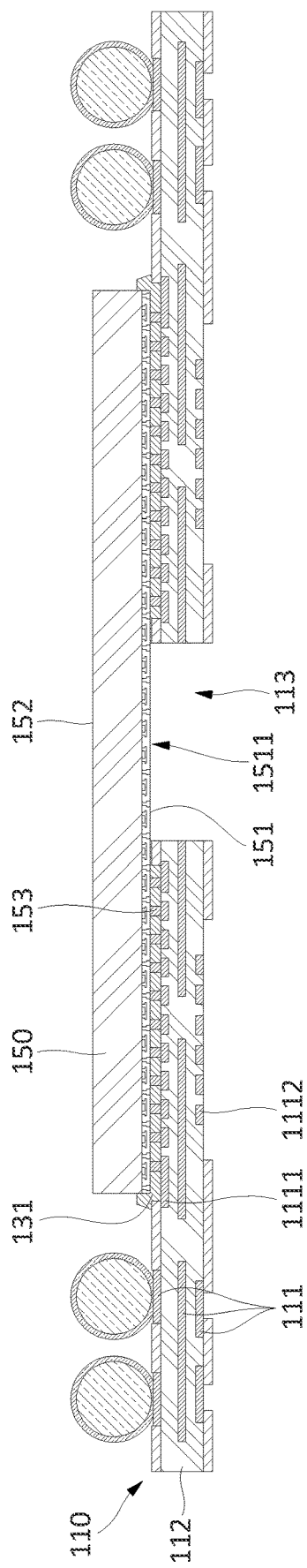
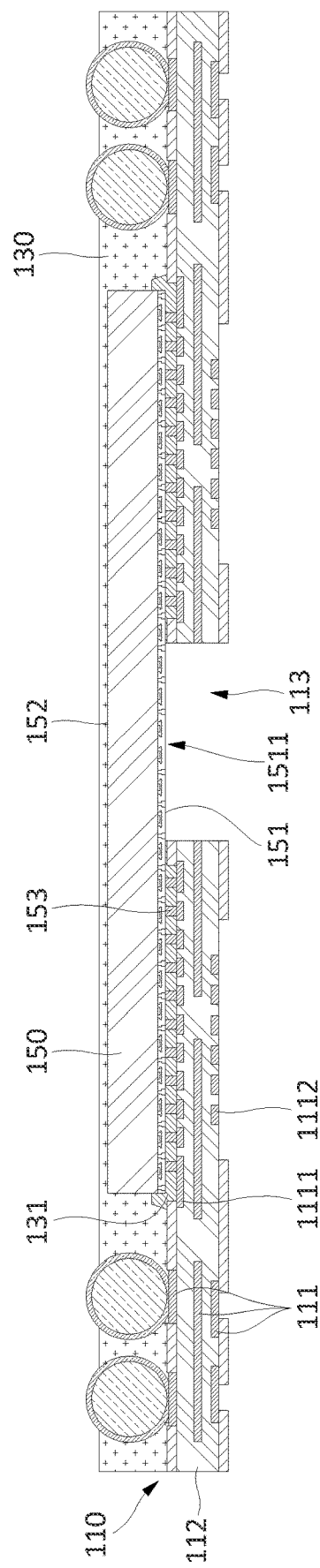
FIG.3A
FIG.3B

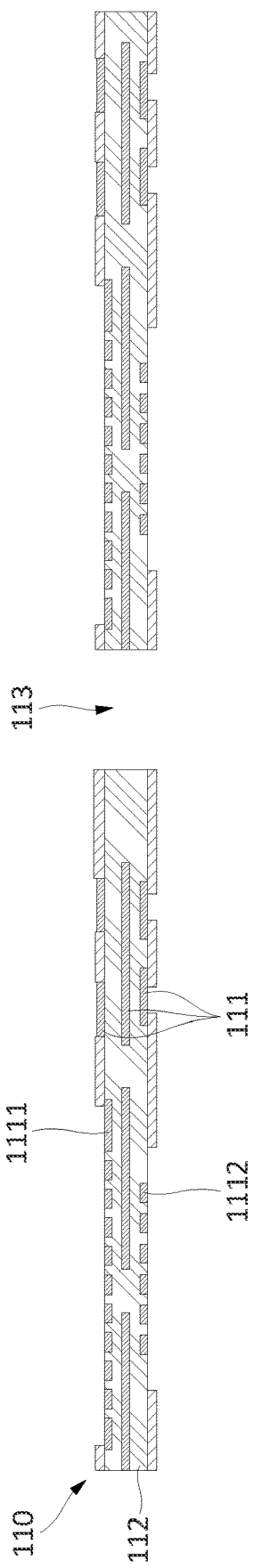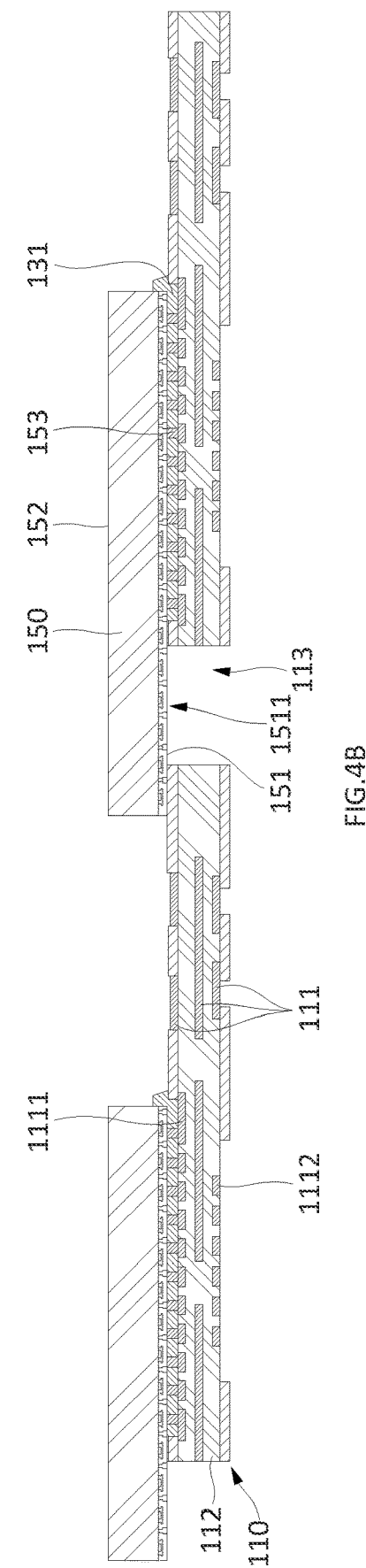

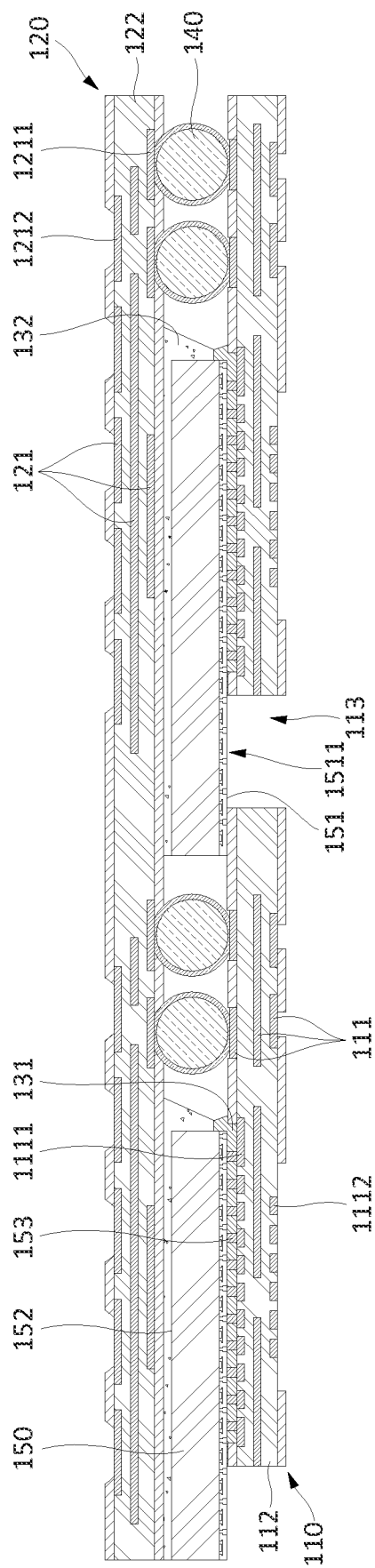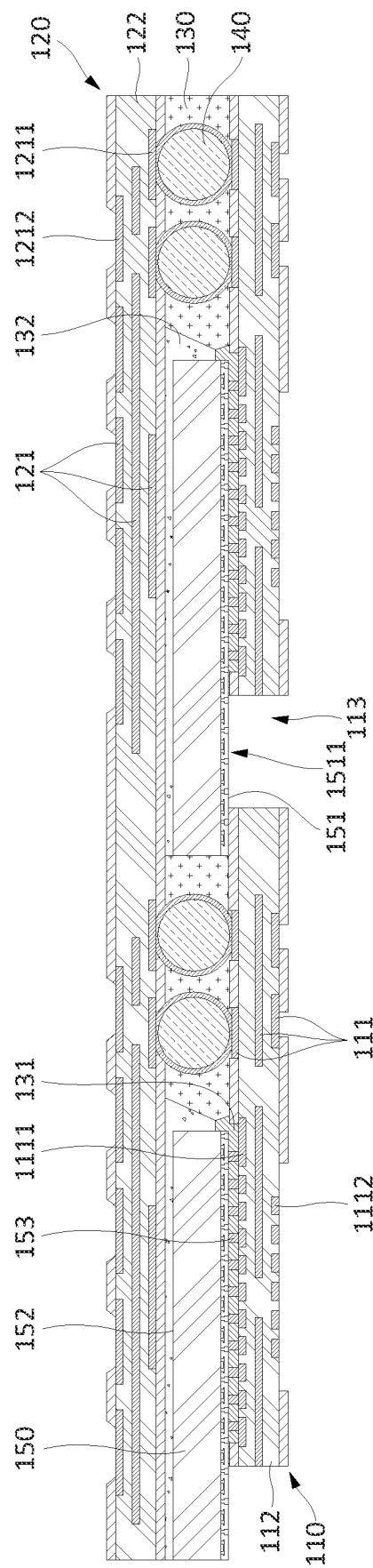

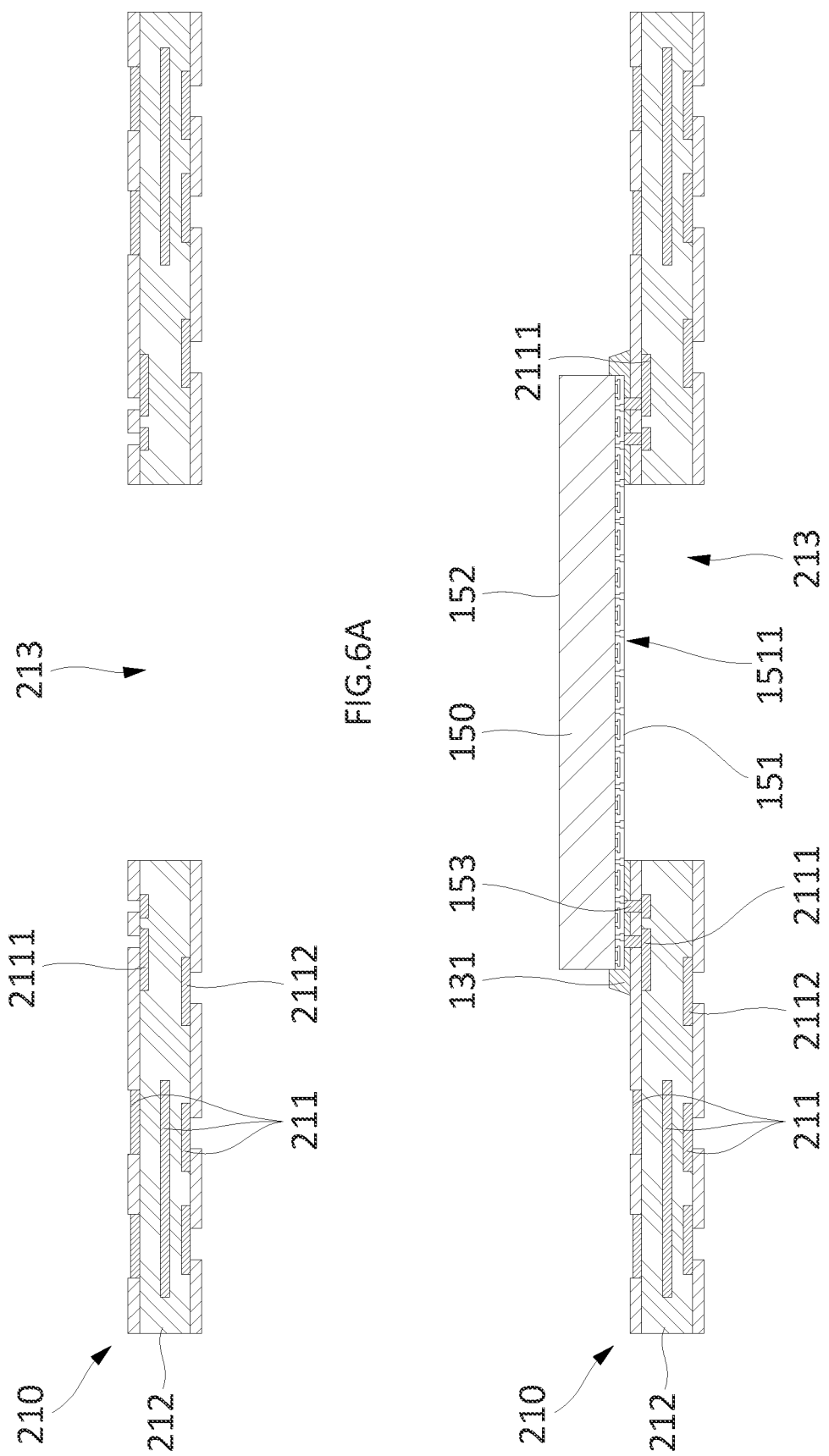

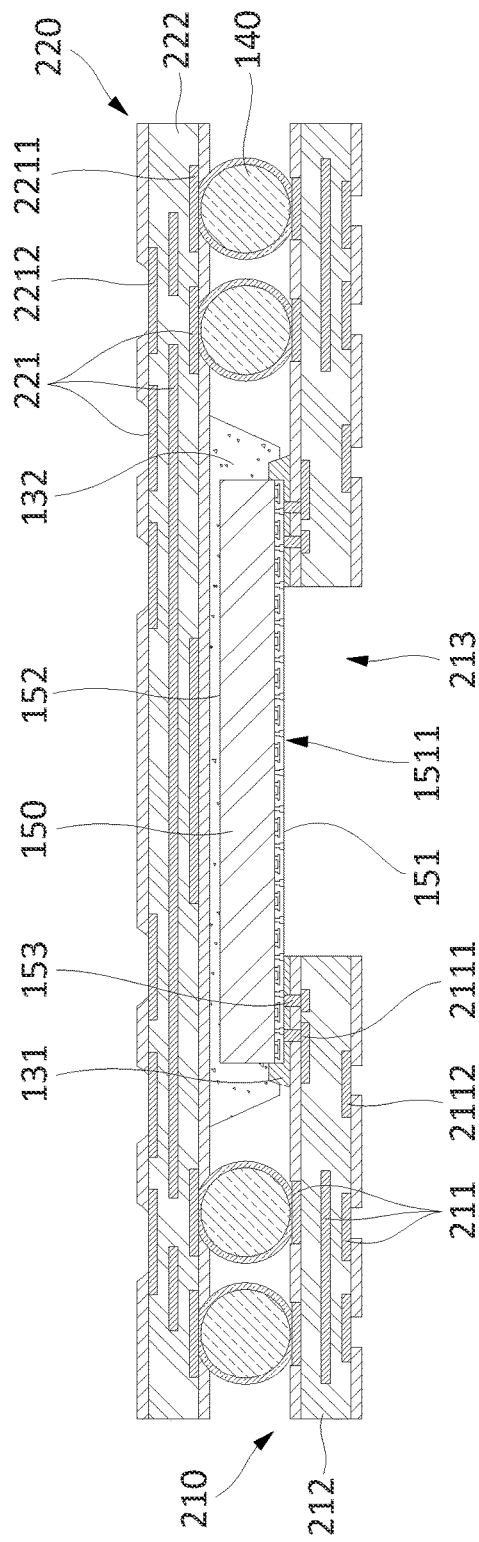
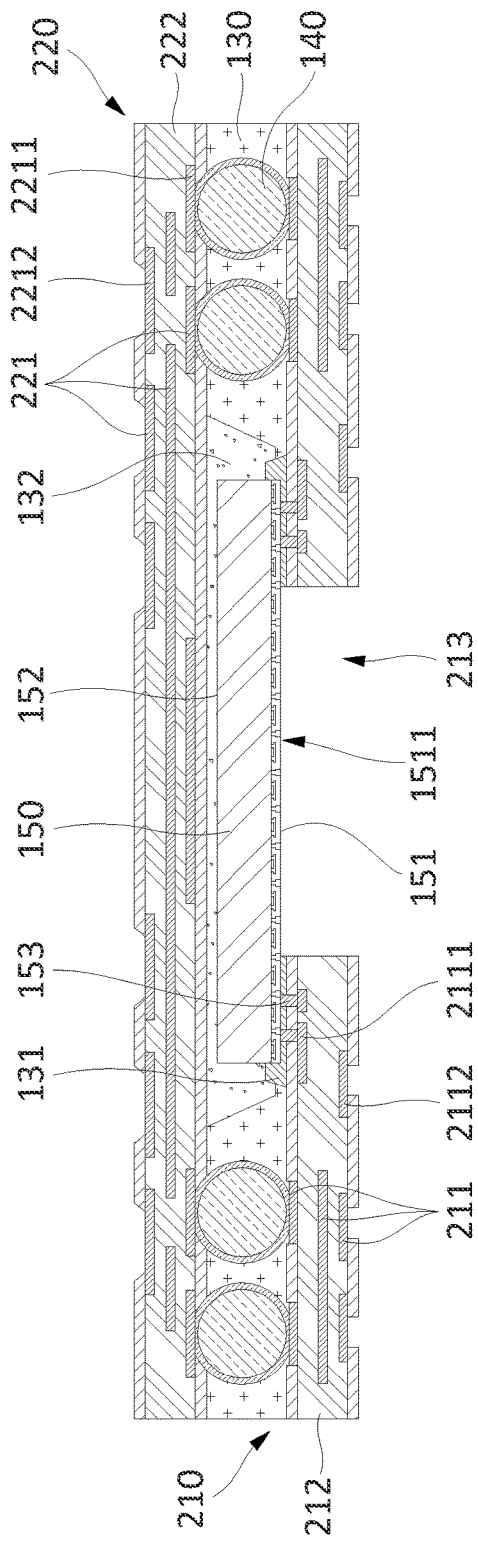
FIG.6C
FIG.6D

SEMICONDUCTOR DEVICES AND METHODS OF MANUFACTURING SEMICONDUCTOR DEVICES

CROSS-REFERENCE TO RELATED APPLICATIONS

The present application is a continuation of application Ser. No. 17/073,025 filed Oct. 16, 2020 and published as US 2022/0122921 A1. Said application Ser. No. 17/073,025 and said US 2022/0122921 A1 are hereby incorporated herein by reference in their entireties.

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 2A to 2H show cross-sectional views of an example method for manufacturing an example electronic device.
FIGS. 3A to 3C show cross-sectional views of an example method for manufacturing an example electronic device.
FIGS. 4A to 4G show cross-sectional views of an example method for manufacturing an example electronic device.
FIGS. 6A to 6G show cross-sectional views of an example method for manufacturing an example electronic device.

Figure 1A:
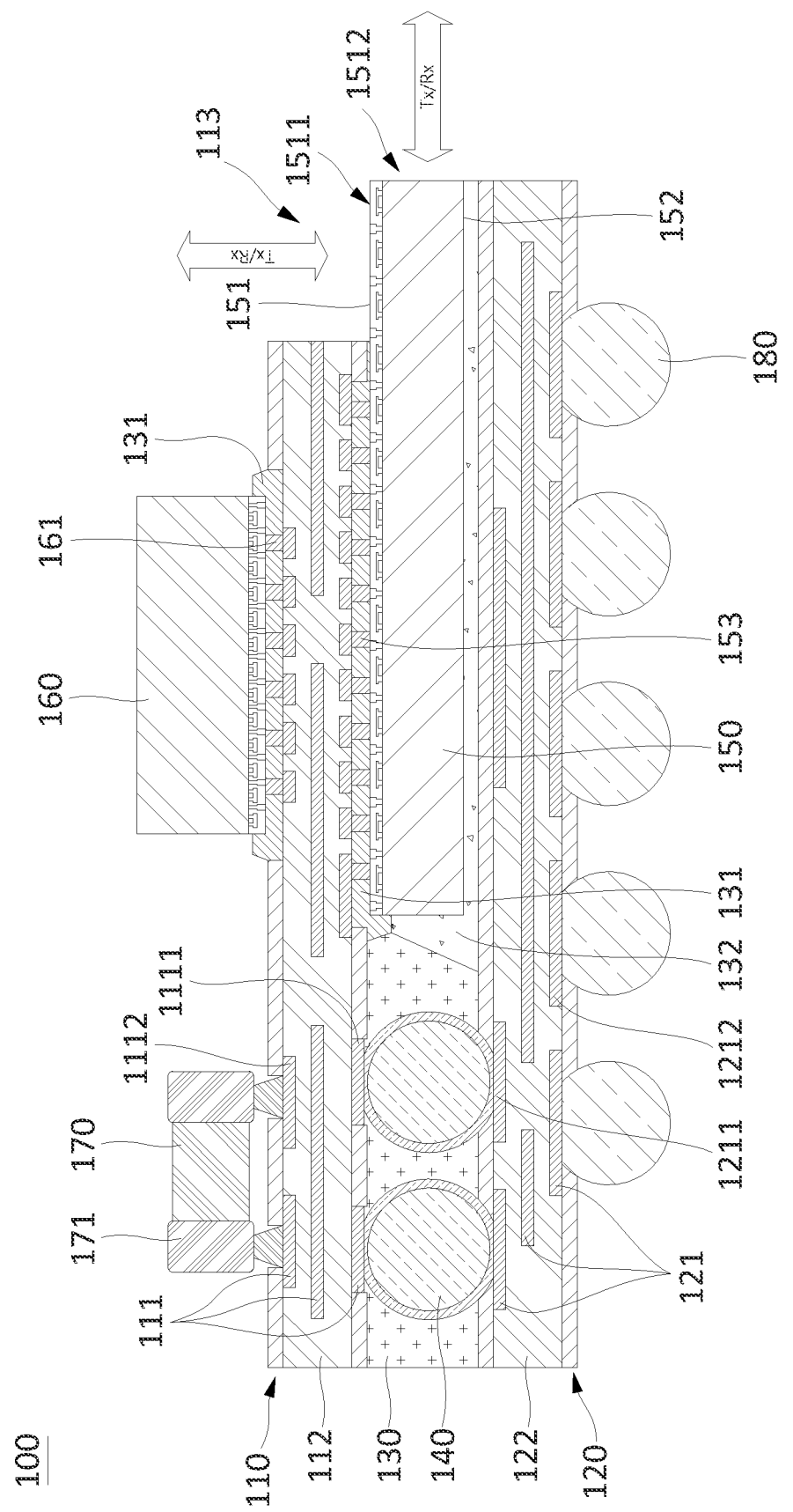
FIGS. 1A to 1C show cross-sectional views of example electronic devices.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," or "including," are "open ended" terms and specify the presence of stated features, but do not preclude the presence or addition of one or more other features. The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

DESCRIPTION

In one example, an electronic device, comprises a first substrate comprising a first conductive structure, a second substrate comprising a second conductive structure, wherein the first substrate is over the second substrate, a first electronic component between the first substrate and the second substrate, a vertical interconnect between the first substrate and the second substrate, wherein the vertical interconnect is coupled with the first conductive structure and the second conductive structure, and an encapsulant between the first substrate and the second substrate and covering the vertical interconnect. A vertical port on the first electronic component is exposed by an aperture of the first substrate.

In another example, an electronic device comprises a first substrate comprising a first conductive structure, wherein the first conductive structure comprises a substrate outward terminal, a second substrate comprising a second conductive structure, a vertical interconnect coupled with the first conductive structure and the second conductive structure, a first electronic component between the first substrate and the second substrate, wherein the first electronic component has a first component terminal on a front side of the first electronic component and coupled with the first conductive structure, and a second electronic component over the first substrate, wherein the second electronic component has a second component terminal coupled with the substrate outward terminal. A lateral port is exposed at a lateral side of the first electronic component, adjacent an end of the second substrate.

A method of manufacturing an electronic device comprises providing a first substrate comprising a first conductive structure, coupling a first electronic component with the first substrate, wherein a vertical port of the first electronic component is exposed by an aperture of the first substrate, providing a second substrate comprising a second conductive structure, providing a vertical interconnect coupled with the first conductive structure and the second conductive structure, and providing an encapsulant between the first substrate and the second substrate and covering the vertical interconnect.

Other examples are included in the present disclosure. Such examples may be found in the figures, in the claims, or in the description of the present disclosure.

Figure 1B:
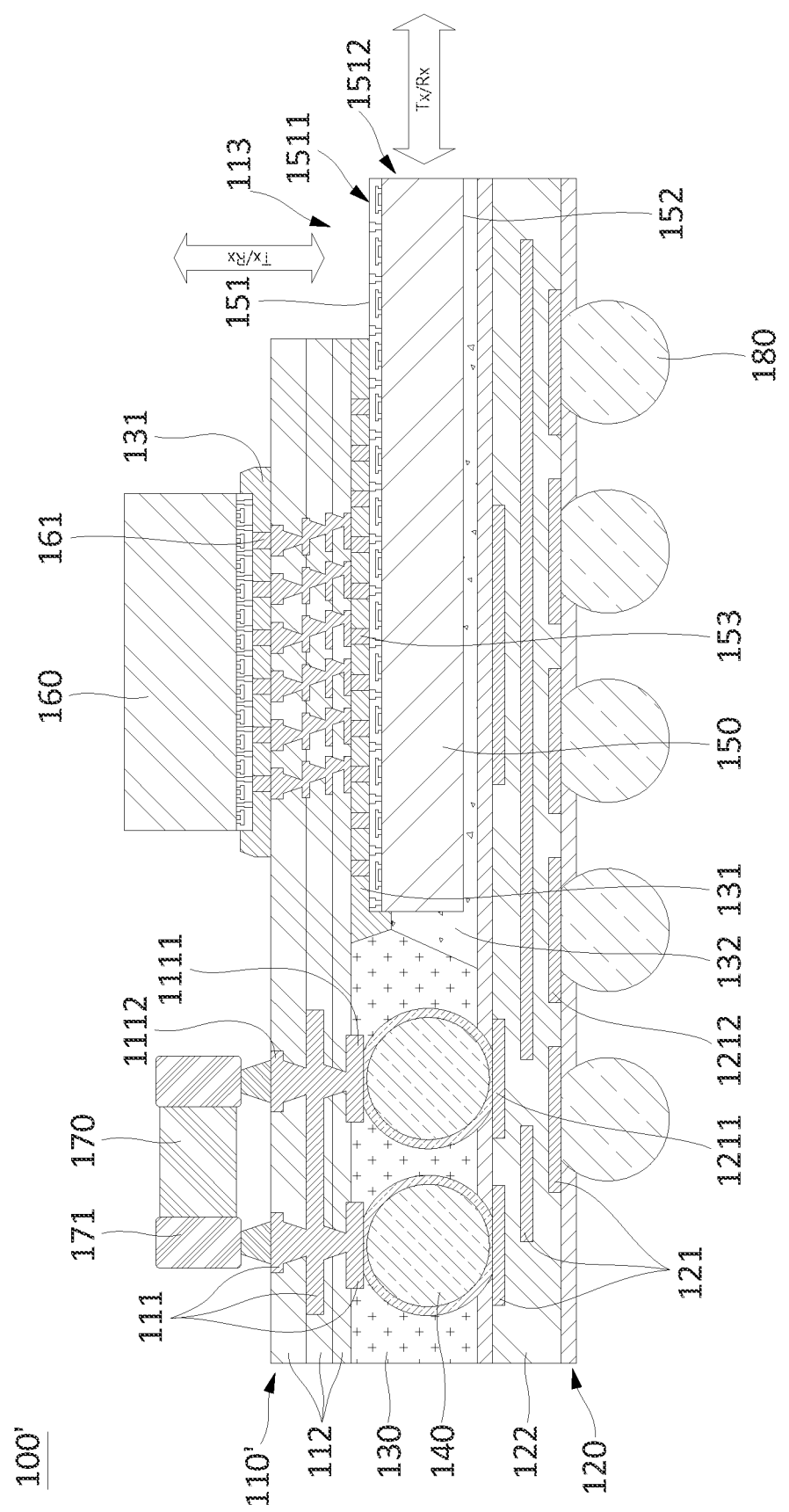
Figure 1C:
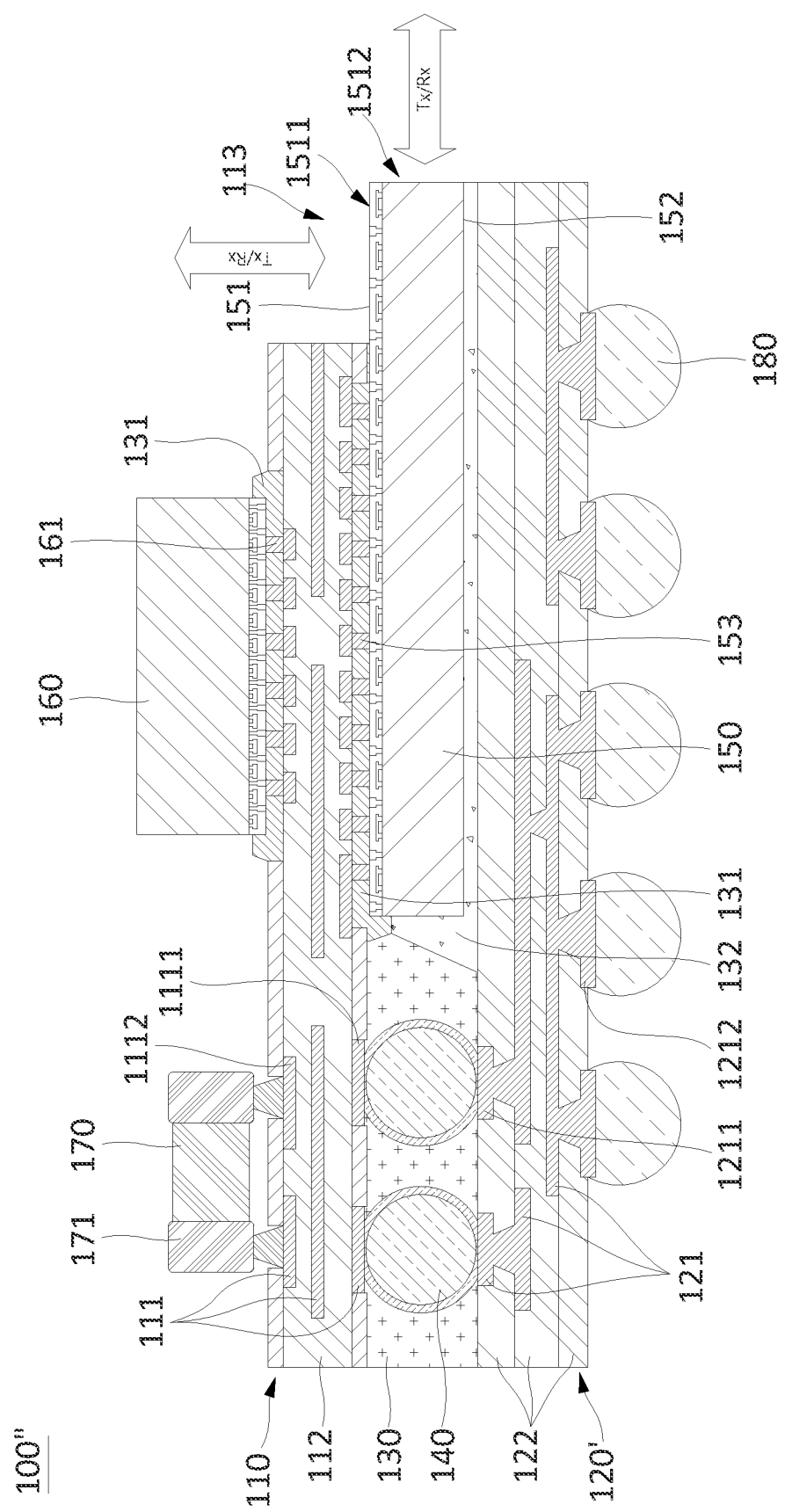

FIGS. 1A to 1C show cross-sectional views of example electronic device 100, electronic device 100', and electronic device 100". In the examples shown in FIG. 1A, FIG. 1B, and FIG. 1C, electronic device 100, electronic device 100', or electronic device 100" can comprise first substrate 110 or first substrate 110', second substrate 120 or second substrate 120', encapsulant 130, vertical interconnect 140, electronic component 150, electronic component 160, or electronic component 170, and external interconnect 180. In this disclosure, reference to electronic device 100 or to its elements can also refer to electronic devices 100' and 100" or to its corresponding elements.

First substrate 110 can comprise conductive structure 111, dielectric structure 112, and aperture 113. Conductive structure 111 can comprise substrate inward terminal 1111 and substrate outward terminal 1112. Second substrate 120 can comprise conductive structure 121 and dielectric structure 122. In some examples, first substrate 110 can be over second substrate 120. Conductive structure 121 can comprise substrate inward terminal 1211 and substrate outward terminal 1212. Electronic component 150 can be between first substrate 110 and second substrate 120, and encapsulant 130 can cover a lateral side of electronic component 150 between first substrate 110 and second substrate 120. In some examples, vertical interconnect 140 can be between first substrate 110 and second substrate 120, and encapsulant 130 can cover vertical interconnect 140. Vertical interconnect 140 can be coupled with conductive structure 111 and conductive structure 121. In some examples, underfill 131 can be positioned between substrate 110 and electronic components 150. In some examples, adhesive 132 can be positioned between substrate 120 and electronic component 150. Electronic component 150 can comprise component front side 151, component back side 152, and component terminal 153. Component front side 151 can comprise vertical port 1511 or lateral port 1512. In some examples, vertical port 1511 can be exposed by aperture 113. In some examples, lateral port 1512 can be at a lateral side of electronic component 150 adjacent an end of substrate 120 and can be exposed from the encapsulant. Electronic component 160 and electronic component 170 can comprise component terminal 161 and terminal 171, respectively.

First substrate 110, second substrate 120, encapsulant 130, vertical interconnect 140, and external interconnect 180 can be referred to as a semiconductor package or a package, and can provide protection for electronic component 150 from external elements or environmental exposure. In addition, the semiconductor package can provide an electrical coupling between an external component and electronic component 150.

Figure 2A:
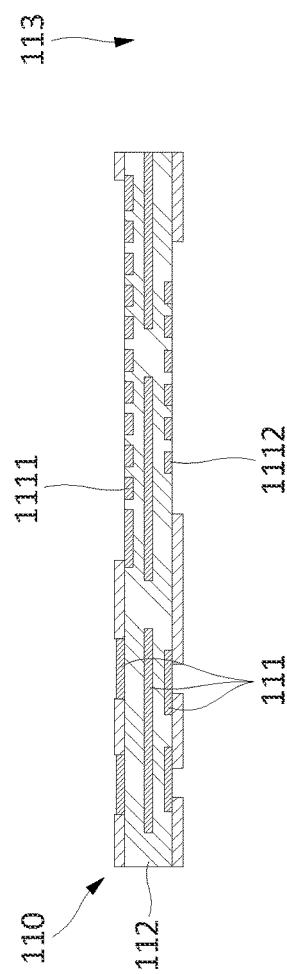

FIGS. 2A to 2H show cross-sectional views of an example method for manufacturing an example electronic device. FIG. 2A shows a cross-sectional view of electronic device 100 at an early stage of manufacture.

In the example shown in FIG. 2A, first substrate 110 having conductive structure 111, dielectric structure 112, and aperture 113 can be prepared. First substrate 110 can comprise or be referred to as an aperture substrate, a partial substrate, or a cavity substrate. In some examples, first substrate 110 can comprise a pre-formed substrate, a laminate substrate, or a redistribution layer (RDL) substrate. First substrate 110 can be a rectangular frame having aperture 113 located at its center or within its perimeter. Although only one aperture 113 is shown in FIG. 2A, one or more apertures 113 can be positioned spaced apart from one another. In some examples, first substrate 110 can be symmetrically formed in left and right directions on the basis of aperture 113. In some examples, first substrate 110 can have a thickness in a range of about 30 micrometers (μm) to about 500 μm.

Conductive structure 111 can comprise or be referred to as one or more traces, pads, terminals, vias, under bump metallizations (UBMs), conductors, conductive materials, conductive patterns, conductive paths, conductive layers, redistribution layers (RDL), wiring patterns, trace patterns, or circuit patterns. Conductive structure 111 can comprise, for example, an electrically conductive material such as copper (Cu), aluminum (Al), palladium (Pd), titanium (Ti), tungsten (W), titanium/tungsten, nickel (Ni), gold (Au), or silver (Ag). Conductive structure 111 can be formed using, for example, sputtering, electroless plating, electroplating physical vapor deposition (PVD), chemical vapor deposition (CVD), metal organic chemical vapor deposition (MOCVD), atomic layer deposition (ALD), low pressure chemical vapor deposition (LPCVD), or plasma enhanced chemical vapor deposition (PECVD). Some portions of conductive structure 111 can be exposed at a first side, such as a top side in FIG. 2A, and a second side, such as a bottom side in FIG. 2A, of first substrate 110. Conductive structure 111 can transfer or redistribute signals, current or voltage within, through, or across first substrate 110. In some examples, conductive structure 111 can have a height in a range of about 30 μm to about 500 μm. Conductive structure 111 can comprise substrate inward terminal 1111 and substrate outward terminal 1112.

Substrate inward terminal 1111 can be exposed at the first side of first substrate 110. Substrate inward terminal 1111 can comprise or be referred to as one or more pads, lands, UBMs, studs, or bumps. In some examples, component terminal 153 of electronic component 150 or vertical interconnect 140 can be coupled to one or more respective substrate inward terminals 1111. Substrate inward terminal 1111 can provide electrical contact between first substrate 110 and electronic component 150 or vertical interconnect 140. In some examples, substrate inward terminal 1111 can have a thickness in a range of about 3 μm to about 200 μm.

Substrate outward terminal 1112 can be exposed at the second side of first substrate 110. Substrate outward terminal 1112 can comprise or be referred to as one or more pads, lands, UBMs, studs, or bumps. In some examples, component terminal 161 or component terminal 171 of electronic component 160 or electronic component 170 can be coupled to one or more respective substrate outward terminal 1112. Substrate outward terminal 1112 can provide electrical contact between first substrate 110 and electronic component 160 or electronic component 170. In some examples, substrate outward terminal 1112 can have a thickness in a range of about 3 μm to about 200 μm.

Dielectric structure 112 can comprise or be referred to as one or more dielectric layers, passivation layers, solder mask layers, core layers, or prepreg layers. Dielectric structure 112 can comprise an electrically insulating material such as a polymer, polyimide (PI), polyethylene (PE), polypropylene (PP), benzocyclobutene (BCB), polybenzoxazole (PBO), bismaleimide triazine (BT), a molding material, a phenol resin, epoxy, silicone, or acrylate polymer. In some examples, dielectric structure 112 can be formed using thermal oxidation, chemical vapor deposition (CVD), physical vapor deposition (PVD), atomic layer deposition (ALD), low pressure chemical vapor deposition (LPCVD), plasma enhanced chemical vapor deposition (PECVD), sheet lamination, printing, spin coating, spray coating, sintering, or evaporating. Dielectric structure 112 can provide structural integrity for first substrate 110, isolation between different elements of conductive structure 111, or protection for conductive structure 111 from external elements or environmental exposure. In some examples, dielectric structure 112 can expose some portions of conductive structure 111 to the first and second sides of first substrate 110. In some examples, one or more layers of dielectric structure 112 can have a thickness in a range of about 3 μm to about 500 μm.

Aperture 113 can be defined at the center of, or within a perimeter of, first substrate 110. In some examples, aperture 113 can comprise or be referred to as a cavity or a hole. In some examples, aperture 113 can comprise one or more apertures spaced apart from one another in first substrate 110. Aperture 113 can be configured to penetrate from the first side to the second side of first substrate 110. In some examples, aperture 113 can be formed by removing a portion of first substrate 110. For example, aperture 113 can be formed by cutting such portion using a laser or a blade, or by etching. In some examples, first substrate 110 can be defined by a substantially hollowed rectangular frame. In some examples, a portion of electronic component 150 can be exposed through aperture 113 when mounted on first substrate 110.

In some examples, the first substrate 110 can be a pre-formed substrate. For example, first substrate 110 of FIG. 1A or first substrate 110 of FIG. 1C can be a pre-formed substrate. The pre-formed substrate can be manufactured prior to attachment to an electronic device and can comprise dielectric layers between respective conductive layers. The conductive layers can comprise copper and can be formed using an electroplating process. The dielectric layers can be relatively thicker non-photo-definable layers that can be attached as a pre-formed film rather than as a liquid and can include a resin with fillers such as strands, weaves, or other inorganic particles for rigidity or structural support. Since the dielectric layers are non-photo-definable, features such as vias or openings can be formed by using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In other examples, the pre-formed substrate can be a coreless substrate which omits the permanent core structure, and the dielectric and conductive layers can be formed on a sacrificial carrier that is removed after formation of the dielectric and conductive layers and before attachment to the electronic device. The pre-formed substrate can rereferred to as a printed circuit board (PCB) or a laminate substrate. Such a pre-formed substrate can be formed through a semi-additive or modified-semi-additive process. Other substrates in this disclosure can also comprise a pre-formed substrate.

In some examples, the first substrate 110 can be a redistribution layer (RDL) substrate. For example, first substrate 110' in FIG. 1B can be an RDL substrate. RDL substrates can comprise one or more conductive redistribution layers and one or more dielectric layers that (a) can be formed layer by layer over an electronic device to which the RDL substrate is to be electrically coupled, or (b) can be formed layer by layer over a carrier that can be entirely removed or at least partially removed after the electronic device and the RDL substrate are coupled together. RDL substrates can be manufactured layer by layer as a wafer-level substrate on a round wafer in a wafer-level process, or as a panel-level substrate on a rectangular or square panel carrier in a panel-level process. RDL substrates can be formed in an additive buildup process that can include one or more dielectric layers alternatingly stacked with one or more conductive layers that define respective conductive redistribution patterns or traces configured to collectively (a) fan-out electrical traces outside the footprint of the electronic device, or (b) fan-in electrical traces within the footprint of the electronic device. The conductive patterns can be formed using a plating process such as, for example, an electroplating process or an electroless plating process. The conductive patterns can comprise an electrically conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process, which can include a photolithographic mask through which light is exposed to photo-pattern desired features such as vias in the dielectric layers. The dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, that could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in other examples the dielectric materials of the RDL substrates can comprise one or more inorganic dielectric layers. Some examples of an inorganic dielectric layer or layers can comprise silicon nitride ($Si_3N_4$), silicon oxide ($SiO_2$), or silicon oxynitride (SiON). The inorganic dielectric layer or layers can be formed by growing the inorganic dielectric layers using an oxidation or nitridization process instead using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can be referred to as a coreless substrate. Other substrates in this disclosure can also comprise an RDL substrate.

Figure 2B:
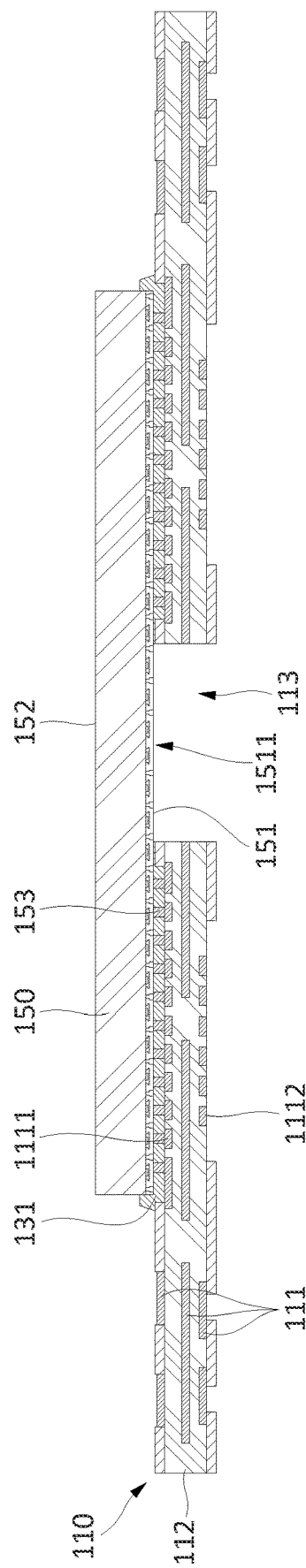

FIG. 2B shows a cross-sectional view of electronic device 100 at a later stage of manufacture. In the example shown in FIG. 2B, electronic component 150 can be attached at the first side of first substrate 110. Electronic component 150 can be coupled to conductive structure 111 of first substrate 110 by, for example, a mass reflow process, a thermal compression process, or a laser bonding process. Electronic component 150 can be attached to first substrate 110 so as to cover aperture 113. In some examples, electronic component 150 can be coupled to substrate inward terminals 1111 positioned at opposite sides of aperture 113 of first substrate 110. An area of electronic component 150 can be larger than that of aperture 113. In some examples, electronic component 150 can have a height in a range of about 30 μm to about 500 μm.

In some examples, electronic component 150 can represent, comprise, or be referred to as one or more semiconductor dies, chips, or packages. In some examples, electronic component 150 can comprise one or more communication elements or ports, such as an optical sensor or emitter, whether inside or outside of the visible light spectrum, a wireless or radio-frequency (RF) sensor or emitter, or a radiation sensor or emitter. Electronic component 150 can comprise component front side 151 and component back side 152. Component front side 151 can comprise or be referred to as an active side, a communication side, or an optical side. Electronic component 150 can be positioned such that component front side 151 faces first substrate 110.

In some examples, a portion or area of electronic component 150 exposed by aperture 113 can comprise or be referred to as vertical port 1511. Vertical port 1511 can comprise or be referred to as a communication terminal, transmitter, or receiver, whether for optical or wireless communication. In some examples, vertical port 1511 at component front side 151 can transmit a communications signal, for example an optical signal or a wireless signal, generated from electronic component 150, or can receive a communications signal, for example an optical signal or a wireless signal, generated from an external component. In some examples, substrate 110 can comprise a first substrate portion and a second substrate portion with aperture 113 between the first substrate portion and the second substrate portion. The first substrate portion and the second substrate portion can be adjacent to or over electronic component 150, for example when the structure is inverted as shown in FIG. 2E. Vertical port 1511 can be exposed through aperture 113 between the first substrate portion and the second substrate portion.

Component terminal 153 can be located at component front side 151 of electronic component 150. Component terminal 153 can comprise a pad, a conductive pillar such as a copper pillar, a conductive post having a solder cap formed on a copper pillar, or a conductive bump. Component terminal 153 can be electrically coupled to substrate inward terminal 1111 of first substrate 110. In some examples, component terminal 153 can be provided as electrical coupling between electronic component 150 and first substrate 110, and can be coupled with conductive structure 111. Underfill 131 can be between electronic component 150 and substrate 110 and can contact component terminal 153. In some examples, component terminal 153 can have a thickness in a range of about 10 μm to about 100 μm.

Underfill 131 can be provided between electronic component 150 and first substrate 110. Underfill 131 can be positioned between component front side 151 of electronic component 150 and the first side of first substrate 110. In some examples, underfill 131 can comprise or be referred to as a capillary underfill. In some examples, underfill 131 can comprise or be referred to as a molded underfill, such as a portion of encapsulant 130, or can be formed when encapsulant 130 is applied. Underfill 131 can cover component lateral sides of component terminals 153. In some examples, underfill 131 can cover exposed areas of substrate inward terminals 1111 coupled with component terminals 153. Underfill 131 can comprise an epoxy, a thermoplastic material, a thermocurable material, polyimide, polyurethane, a polymeric material, a filled epoxy, a filled thermoplastic material, a filled thermocurable material, a filled polyimide, a filled polyurethane, a filled polymeric material, or a fluxed underfill. In some examples, underfill 131 can secure or protect the coupling of component terminals 153 of electronic component 150 to first substrate 110.

FIG. 2C shows a cross-sectional view of electronic device 100 at a later stage of manufacture. In the example shown in FIG. 2C, vertical interconnects 140 can be attached to the first side of substrate 110, second substrate 120 can be attached over component back side 152 of electronic component 150 and over vertical interconnects 140, and vertical interconnects 140 can couple first substrate 110 and second substrate 120 to each other. Second substrate 120 can be wider than electronic component 150. In some examples, second substrate 120 can entirely cover electronic component 150 and first substrate 110.

In some examples, second substrate 120 can comprise or be referred to as a pre-formed substrate, a laminate substrate, or an RDL substrate. Substrate 120 can be similar to substrate 110 in terms of materials, structures, or formation options, but need not comprise or have a cavity. In some examples, second substrate 120 can have a thickness in a range of about 30 μm to about 500 μm. In some examples, a width of second substrate 120 can be substantially the same as that of first substrate 110. Second substrate 120 can comprise a first side, such as a bottom side shown in FIG. 2C, and a second side, such as a top side as shown in FIG. 2C. The first side of second substrate 120 can face the first side of first substrate 110.

Conductive structure 121 can comprise or be referred to as one or more traces, pads, terminals, vias, UBMs, conductors, conductive materials, conductive patterns, conductive paths, conductive layers, redistribution layers (RDL), wiring patterns, trace patterns, or circuit patterns. Conductive structure 121 can comprise, for example, an electrically conductive material, such as copper (Cu), aluminum (Al), palladium (Pd), titanium (Ti), tungsten (W), titanium/tungsten, nickel (Ni), gold (Au), or silver (Ag). Conductive structure 121 can be formed using, for example, sputtering, electroless plating, physical vapor deposition (PVD), chemical vapor deposition (CVD), metal organic chemical vapor deposition (MOCVD), atomic layer deposition (ALD), low pressure chemical vapor deposition (LPCVD), or plasma enhanced chemical vapor deposition (PECVD). A portion of conductive structure 121 can be exposed to first and second sides of second substrate 120. Conductive structure 121 can transfer or redistribute signals, current or voltage within second substrate 120. In some examples, conductive structure 121 can have a thickness in a range of about 30 μm to about 500 μm. Conductive structure 121 can comprise substrate inward terminal 1211 and substrate outward terminal 1212.

Substrate inward terminal 1211 can be exposed at the first side of second substrate 120. Substrate inward terminal 1211 can comprise or be referred to as one or more pads, lands, UBMs, studs, or bumps. In some examples, vertical interconnect 140 can be coupled to substrate inward terminal 1211. In some examples, substrate inward terminal 1211 can be laterally displaced from a footprint of electronic component 150. Substrate inward terminal 1211 can provide an electrical contact between second substrate 120 and vertical interconnect 140. In some examples, substrate inward terminal 1211 can have a thickness in a range of about 3 μm to about 200 μm.

Substrate outward terminal 1212 can be exposed at the second side of second substrate 120. Substrate outward terminal 1212 can comprise or be referred to as one or more pads, lands, UBMs, studs or bumps. In some examples, external interconnect 180 can be coupled to substrate outward terminal 1212. Substrate outward terminal 1212 can provide an electrical contact between second substrate 120 and external interconnect 180. In some examples, substrate outward terminal 1212 can have a thickness in a range of about 3 μm to about 200 μm.

Dielectric structure 122 can comprise or be referred to as one or more dielectric layers, passivation layers, solder mask layers, core layers, or prepreg layers. Dielectric structure 122 can comprise an electrically insulating material such as a polymer, polyimide (PI), polypropylene (PP), polyethylene (PE), benzocyclobutene (BCB), polybenzoxazole (PBO), bismaleimide triazine (BT), a molding material, a phenol resin, epoxy, silicone, or an acrylate polymer. In some examples, dielectric structure 122 can be formed by, for example, thermal oxidation, chemical vapor deposition (CVD), physical vapor deposition (PVD), atomic layer deposition (ALD), low pressure chemical vapor deposition (LPCVD), plasma enhanced chemical vapor deposition (PECVD), sheet lamination, printing, spin coating, spray coating, sintering, or evaporating. Dielectric structure 122 can provide protection for conductive structure 121 from external elements or environmental exposure. In some examples, dielectric structure 122 can expose a portion of conductive structure 121 to first and second sides of second substrate 120. Dielectric structure 122 can have a thickness in a range of about 30 µm to about 500 µm.

Vertical interconnects 140 can be positioned laterally displaced from electronic component 150, and can electrically couple first substrate 110 and second substrate 120 to each other. Vertical interconnect 140 can be coupled to substrate inward terminal 1111 of first substrate 110 and to substrate inward terminal 1211 of second substrate 120.

In some examples, vertical interconnect 140 can be attached first to substrate inward terminal 1211 of second substrate 120, and can then be mounted on first substrate 110, electrically coupled to substrate inward terminal 1111 of first substrate 110, for example through a reflow process. In some examples, vertical interconnect 140 can be attached to substrate inward terminal 1111 of first substrate 110, and then second substrate 120 can be mounted over electronic component 150 such that substrate inward terminals 1211 of second substrate 120 can align with and couple to vertical interconnects 140 through, for example, a reflow process.

Vertical interconnect 140 can comprise or be referred to as metal-core solder-coated balls, solder balls, vertical wires, posts, pillars, or bumps. Vertical interconnect 140 can comprise tin (Sn), silver (Ag), lead (Pb), copper (Cu), Sn—Pb, $Sn_{37}$—Pb, $Sn_{95}$—Pb, Sn—Pb—Ag, Sn—Cu, Sn—Ag, Sn—Au, Sn—Bi, or Sn—Ag—Cu. In some examples, vertical interconnect 140 can be formed by a ball drop process, a screen-printing process, an electroplating process, or a deposition process. In some examples, vertical interconnect 140 can have a height in a range of about 30 µm to about 500 µm.

Adhesive 132 can be optionally provided between second substrate 120 and electronic component 150. Adhesive 132 can be positioned between the first side of second substrate 120 and component back side 152 of electronic component 150. In some examples, adhesive 132 can extend beyond lateral sides of electronic component 150 or can cover portions of lateral sides of electronic component 150 or of underfill 131. In some examples, adhesive 132 can extend to contact portions of underfill 131. Adhesive 132 can serve to secure second substrate 120 to electronic component 150. Adhesive 132 can also serve to avoid voids that could be formed in the gap between electronic component 150 and second substrate 120 when encapsulant 130 is applied, preventing encapsulant 130 from having to flow through such narrower gap. Adhesive 132 can comprise a thermocurable adhesive, a photocurable adhesive, or a non-curable adhesive, for example a rubber-based adhesive, an acryl-based adhesive, a vinyl alkyl ether-based adhesive, a silicone-based adhesive, a polyester-based adhesive, a polyamide-based adhesive, or a urethan-based adhesive. In some examples, adhesive 132 can be applied on component back side 152 of electronic component 150, and second substrate 120 can then be mounted on electronic component 150, followed by curing adhesive 132, to secure second substrate 120 to electronic component 150.

FIG. 2D shows a cross-sectional view of electronic device 100 at a later stage of manufacture. In the example shown in FIG. 2D, encapsulant 130 can be formed between first substrate 110 and second substrate 120. Encapsulant 130 can encapsulate the lateral sides of electronic component 150, and can laterally cover vertical interconnect 140. In some examples, encapsulant 130 can be provided after vertical interconnect 140 is coupled with substrate 110 and substrate 120. In some examples encapsulant 130 can be provided between electronic component 150 and first substrate 110, such as where underfill 131 is omitted or where underfill 131 is a molded underfill portion of encapsulant 130. In some examples encapsulant 130 can be provided between electronic component 150 and second substrate 120, such as where adhesive 132 is omitted. Encapsulant 130 can comprise or be referred to as a mold material, a protection material, a mold compound, or a resin. In some examples, encapsulant 130 can comprise a filler-reinforced polymer, a polymer composite material, a polymer having inorganic fillers, an epoxy resin, an epoxy resin having fillers, an epoxy acrylate having fillers, a silicone resin, or the like. Encapsulant 130 can be formed by any of a variety of processes including, for example, a compression molding process, a transfer molding process, a vacuum lamination process, a liquid phase encapsulant molding process, a paste printing process, or a film assisted molding process. In some examples, encapsulant 130 can have a height in a range of about 30 µm to about 500 µm.

In some examples, the second substrate 120 can be a pre-formed substrate. For example, second substrate 120 in FIG. 1A or second substrate 120 in FIG. 1B can be a pre-formed substrate.

In some examples, the second substrate 120 can be an RDL substrate. For example, second substrate 120' in FIG. 1C can be an RDL substrate. As an option, when second substrate 120' is an RDL substrate, electronic device 100" can be formed by a method that replaces the concept of FIGS. 2C-2D with the concept of FIGS. 3A-3C. In such option, encapsulant 130 can be formed on first substrate 110, and then second substrate 120' can be formed as an RDL substrate on encapsulant 130. As another option, second substrate 120' can be formed as an RDL substrate over a carrier, and electronic device 100" can still be formed by the method comprising stages 2C-2D. In such an option, second substrate 120' can be attached while still coupled to its carrier, encapsulant 130 can be formed, and then the carrier can be removed from second substrate 120'.

In some examples, first substrate 110 or first substrate 110', and second substrate 120 or second substrate 120', can comprise pre-formed substrates. In some examples, first substrate 110 or first substrate 110', and second substrate 120 or second substrate 120', can comprise RDL substrates. In some examples, first substrate 110 or first substrate 110' can comprise an RDL substrate, and second substrate 120 or second substrate 120' can comprise a pre-formed substrate. In some examples, first substrate 110 or first substrate 110' can comprise a pre-formed substrate, and second substrate 120 or second substrate 120' can comprise an RDL substrate.

FIG. 2E shows a cross-sectional view of electronic device 100 at a later stage of manufacture. FIG. 2E shows the assembly of FIG. 2D flipped over, so first substrate 110 is positioned above and second substrate 120 is positioned below. In the example shown in FIG. 2E, electronic component 160 or electronic component 170 can be attached to the second side of first substrate 110 over first substrate 110, and external interconnect 180 can be attached to the second side of second substrate 120. Electronic component 160 or electronic component 170 can be coupled to substrate outward terminals 1112 of first substrate 110. External interconnects 180 can be coupled to substrate outward terminals 1212 of second substrate 120.

In some examples, electronic component 160 can comprise an active component or a digital component. Electronic component 160 can comprise, for example, an electrical circuit, such as a memory, a digital signal processor (DSP), a microprocessor, a network processor, a power management processor, an audio processor, a radio-frequency (RF) circuit, a wireless baseband system-on-chip (SoC) processor, a sensor, or an application specific integrated circuit (ASIC). Optionally, electronic component 160 can comprise a passive component such as an integrated passive device (IPD), a capacitor, an inductor, a diode, or a light emitting diode (LED).

Electronic component 160 can comprise component terminal 161. Component terminal 161 can be electrically coupled to substrate outward terminal 1112 of first substrate 110 and can be coupled with conductive structure 111. Component terminal 161 can comprise one or more pads, conductive pillars such as copper pillars, conductive posts having solder caps formed on copper pillars, or conductive bumps. In some examples, component terminal 161 can be provided as an electrical coupling between electronic component 160 and first substrate 110. Electronic component 160 can be electrically coupled to electronic components 150 or 170, or to vertical interconnect 140, through conductive structure 111.

Optionally, underfill 131 can be provided between electronic component 160 and first substrate 110. Underfill 131 can be positioned between a bottom side electronic component 160 and the second side of first substrate 110. Underfill 131 can be formed to laterally cover component terminal 161. In some examples, underfill 131 can cover part of substrate outward terminal 1112 coupled with component terminal 161.

In some examples, electronic component 170 can comprise a passive component such as an integrated passive device (IPD), a capacitor, an inductor, a diode or an LED. Optionally, electronic component 170 can comprise an active component or a digital component. Electronic component 170 can comprise, for example, an electrical circuit, such as a memory, a digital signal processor (DSP), a microprocessor, a network processor, a power management processor, an audio processor, a radio-frequency (RF) circuit, a wireless baseband system-on-chip (SoC) processor, a sensor, or an application specific integrated circuit (ASIC).

Electronic component 170 can comprise component terminal 171. Component terminal 171 can be electrically coupled to substrate outward terminal 1112 of first substrate 110. In some examples, component terminals 171 can comprise one or more pads, conductive pillars such as copper pillars, conductive posts having solder caps formed on copper pillars, or conductive bumps. In some examples, component terminal 171 can be provided as electrical coupling between electronic component 170 and first substrate 110. Electronic component 170 can be electrically coupled to electronic component 150 or electronic component 160, or to vertical interconnect 140, through conductive structure 111.

External interconnect 180 can be coupled to substrate outward terminal 1212 of second substrate 120. In some examples, external interconnect 180 can be electrically coupled to vertical interconnect 140 through conductive structure 121. In some examples, external interconnect 180 can comprise or be referred to as one or more conductive bumps, lands, balls, pillars, posts, or solder balls. External interconnect 180 can comprise tin (Sn), silver (Ag), lead (Pb), copper (Cu), Sn—Pb, $Sn_{37}$—Pb, $Sn_{95}$—Pb, Sn—Pb—Ag, Sn—Cu, Sn—Ag, Sn—Au, Sn—Bi, or Sn—Ag—Cu. External interconnects 180 can be formed by, for example, a ball drop process, a screen-printing process, an electroplating process, or a deposition process. In some examples, external interconnect 180 can have a height in a range of about 50 µm to about 500 µm. External interconnect 180 can provide electrical path between second substrate 120 and an external component.

FIG. 2F shows a cross-sectional view of electronic device 100 at a later stage of manufacture. In the example shown in FIG. 2F, a singulation or sawing process is carried through first substrate 110 and second substrate 120 to separate the assembly into separate devices, for example see dotted lines S1 and S2. In some examples, the singulation process can be performed using a singulation tool such as a diamond blade or a laser beam. In some examples, the singulation tool can first substrate 110, encapsulant 130, and second substrate 120 along singulation lines S1. In some examples, the singulation tool can also cut along singulation line S2 through aperture 113 and electronic component 150.

Figure 2G:
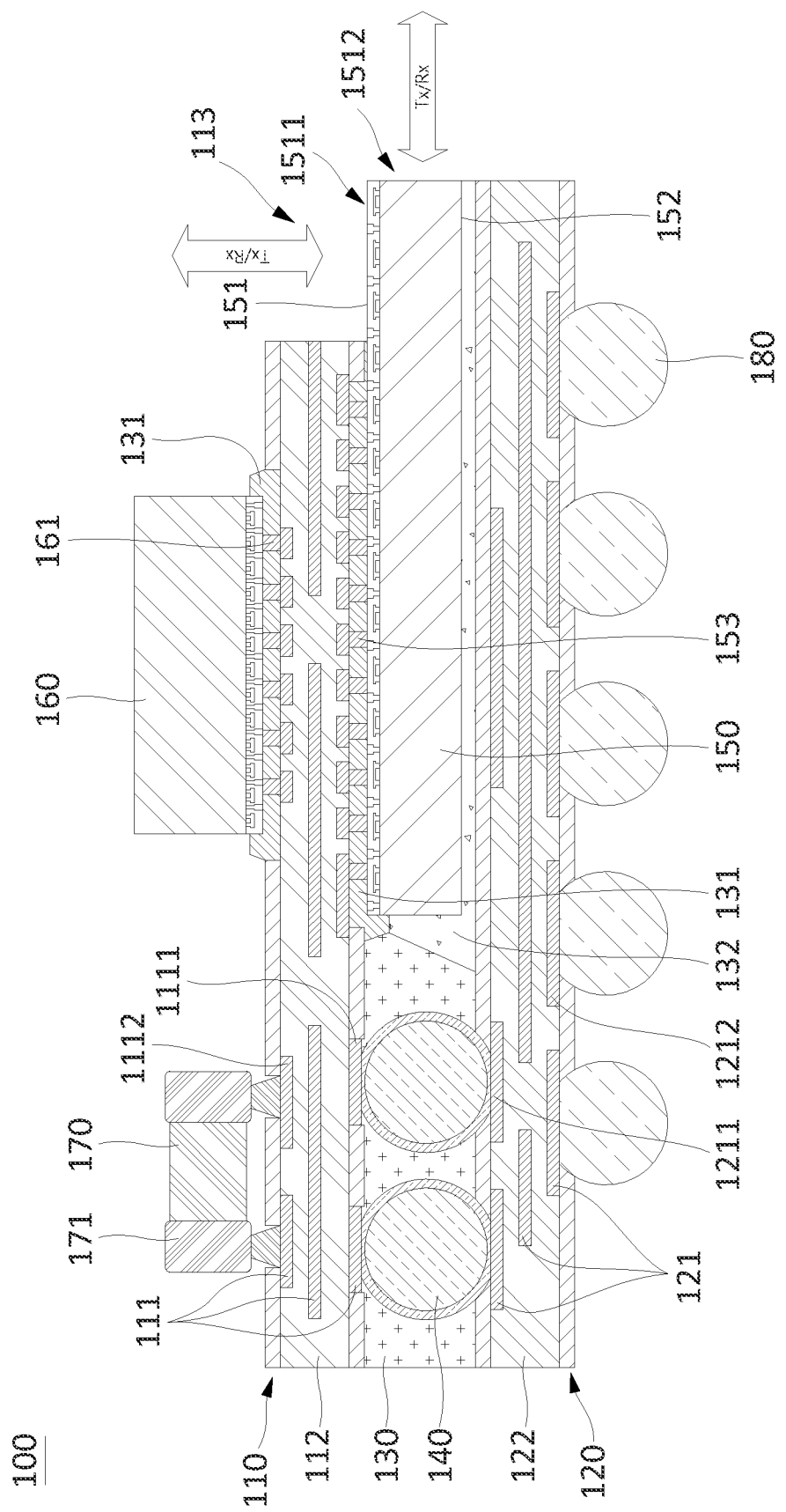

FIG. 2G shows electronic device 100 completed after the singulation of FIG. 2F, comprising first substrate 110, second substrate 120, encapsulant 130, vertical interconnect 140, electronic component 150, electronic component 160, and electronic component 170, and external interconnect 180. In the example shown in FIG. 2G, a lateral side of electronic component 150 is be exposed. A portion or area of electronic component 150 exposed at the lateral side can comprise or be referred to as lateral port 1512. Lateral port 1512 can comprise or be referred to as a communication terminal, transmitter, or receiver, whether for optical or wireless communication. In some examples, lateral port 1512 can transmit a communications signal, for example an optical signal or a wireless signal, generated from electronic component 150, or can receive a communications signal, for example an optical signal or a wireless signal, generated from an external component. In some examples, electronic component 150 can have a component terminal 153 on a front side of electronic component 150 and coupled with conductive structure 111. Electronic component 150 can be between substrate 110 and substrate 120, and electronic component 160 can be over substrate 110. Electronic component 160 can have a component terminal 161 coupled with substrate outward terminal 1112 of conductive structure 111. Vertical interconnect 140 can be coupled with conductive structure 111 and conductive structure 121, and encapsulant 130 can cover vertical interconnect between substrate 110 and substrate 120. Adhesive 132 can be between electronic component 150 and substrate 120, and can contact a latera side of electronic component 150 between electronic component 150 and encapsulant 130.

Lateral port 1512 can be similar to vertical port 1511, and can be oriented laterally instead of vertically. In some examples lateral port 1512 can be distinct from vertical port 1511. In some examples, lateral port 1512 can be an extension of vertical port 1511. In some examples vertical port 1511 and lateral port 1512 can operate, whether jointly or independently of each other, to send or receive communications. Lateral port 1512 can be exposed at a lateral side of electronic component 150 adjacent an end of substrate 120. In some examples, vertical port 1511 at the front side of electronic component 150 can be exposed by aperture 113 of substrate 110.

Figure 2H:
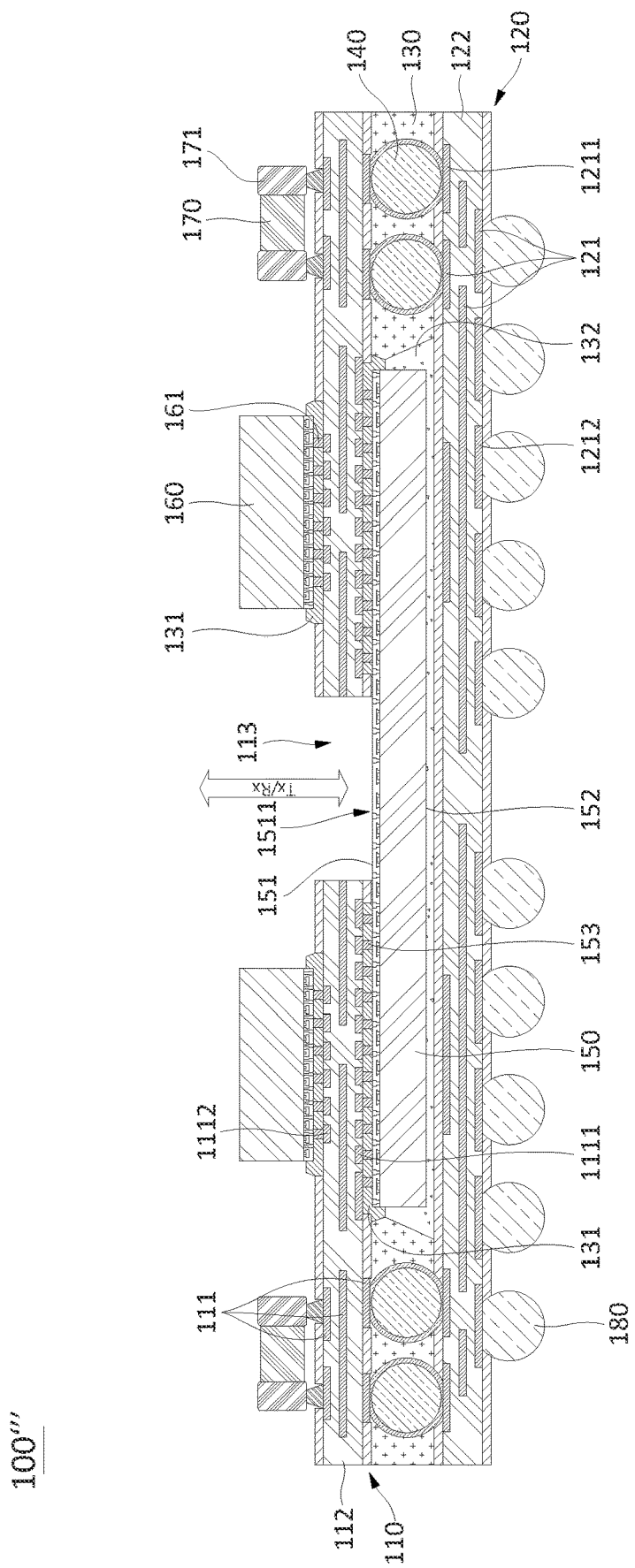

FIG. 2H shows electronic device 100''' as an alternate implementation of electronic device 100 completed after the singulation stage of FIG. 2F. In such a scenario, the singulation of FIG. 2F can be carried out along singulation lines S1, but not along singulation line S2. Accordingly, electronic device 100''' comprises vertical port 1511 but lacks lateral port 1512.

Figure 3C:
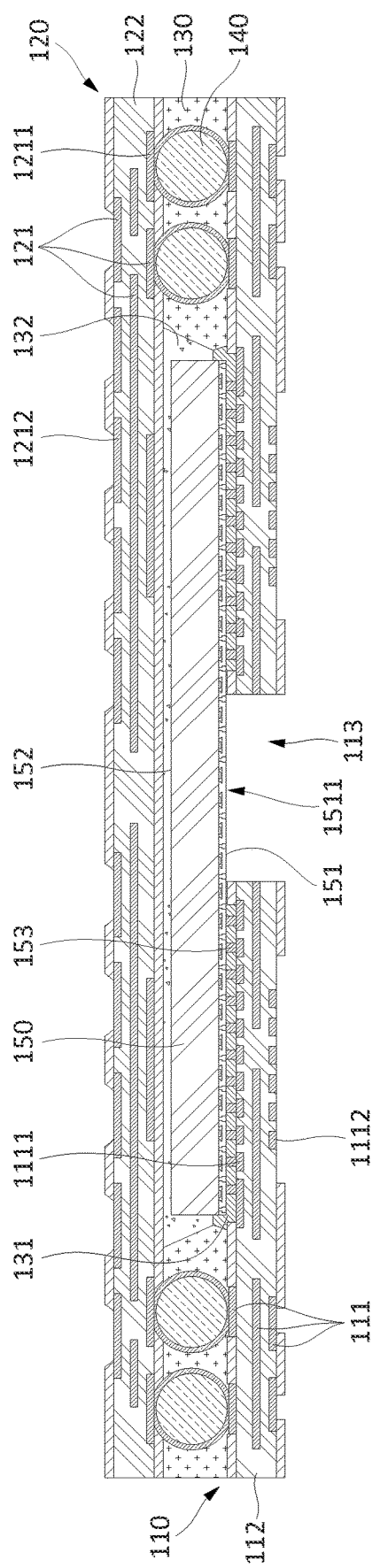

FIGS. 3A to 3C show cross-sectional views of an example method for manufacturing an example electronic device. FIGS. 3A-3C can correspond to the stages shown in FIGS. 2C-2D, or can be carried out instead between the stages of FIG. 2B and FIG. 2E, in the example method shown in FIGS. 2A to 2H.

In the example shown in FIG. 3A, vertical interconnect 140 can be attached to first substrate 110. Vertical interconnect 140 can be positioned laterally displaced from electronic component 150 and can be coupled to substrate inward terminal 1111.

FIG. 3B shows a cross-sectional view of electronic device 100 at a later stage of manufacture. In the example shown in FIG. 3B, encapsulant 130 can encapsulate electronic component 150 and vertical interconnect 140 on first substrate 110. In some examples, encapsulant 130 can be provided after vertical interconnect 140 is coupled with substrate 110 and before vertical interconnect 140 is coupled with substrate 120 as shown in FIG. 3C. Encapsulant 130 laterally encapsulates sides of electronic component 150 and of vertical interconnects 140. In some examples, encapsulant 130 can be provided by film-assisted molding. In some examples, encapsulant 130 can encapsulate component back side 152. In some examples, encapsulant 130 can expose or leave protruded a portion of vertical interconnect 140. In some examples, encapsulant 130 can be formed to entirely cover vertical interconnect 140 and electronic component 150, and then the top of encapsulant 130 can be ground to reveal the top of vertical interconnect 140 or of electronic component 150.

FIG. 3C shows a cross-sectional view of electronic device 100 at a later stage of manufacture. In the example shown in FIG. 3C, second substrate 120 can be provided over encapsulant 130. Second substrate 120 can be aligned to allow substrate inward terminal 1211 to be electrically coupled to vertical interconnect 140. Second substrate 120 can comprise or be referred to as a pre-formed substrate that can be attached over the assembly described for FIG. 3B, or as an RDL substrate that can be formed layer by layer over the assembly described for FIG. 3B. Optionally, adhesive 132 can be provided between electronic component 150 and second substrate 120. In some examples, adhesive 132 can further extend between encapsulant 130 and second substrate 120. In some examples, prior to attachment of second substrate 120, any encapsulant 130 formed on component back side 152 of electronic component 150 can first be removed, and adhesive 132 can then be provided over component back side 152 of electronic component 150. Adhesive 132 can secure the attachment of second substrate 120 to the rest of the assembly below.

FIGS. 4A to 4G show cross-sectional views of an example alternative method for manufacturing an example electronic device. Aspects of the stages shown in FIG. 4A to 4G can be similar to those described with respect to FIGS. 2A-2H or FIGS. 3A-3C.

FIG. 4A shows a cross-sectional view of electronic device 100 at an early stage of manufacture. In some examples, the stage of FIG. 4A can be similar stage of FIG. 2A in several aspects. In the example shown in FIG. 4A, first substrate 110 comprises conductive structure 111, dielectric structure 112, and aperture 113. In some examples, first substrate 110 can have a portion positioned at left side of aperture 113 and a similar portion positioned at right side of aperture 113. In some examples, first substrate 110 can be configured so the structure positioned at one side of aperture 113 are repeatedly arrayed. In some examples, a width of aperture 113 shown in FIG. 4A can be smaller than that of aperture 113 shown in FIG. 2A.

FIG. 4B shows a cross-sectional view of electronic device 100 at a later stage of manufacture. In some examples, the stage of FIG. 4B can be similar stage of FIG. 2B in several aspects. In the example shown in FIG. 4B, electronic component 150 can be attached to the first side of first substrate 110. Electronic component 150 can be electrically coupled to a conductive structure 111 at one side of aperture 113 on first substrate 110. Electronic component 150 can extend to an upper portion of first substrate 110 at the other side of aperture 113 while covering aperture 113. Component terminal 153 of electronic component 150 can be electrically coupled to substrate inward terminal 1111 positioned at one side of aperture 113.

Optionally, underfill 131 can be formed between electronic component 150 and first substrate 110. Underfill 131 can be located between electronic component 150 and first substrate 110 positioned at one side of aperture 113.

FIG. 4C shows a cross-sectional view of electronic device 100 at a later stage of manufacture. In some examples, the stage of FIG. 4C can be similar stage of FIG. 2C in several aspects. In the example shown in FIG. 4C, second substrate 120 can be attached to the upper portion of electronic component 150, and vertical interconnect 140 can electrically couple first substrate 110 and second substrate 120 to each other. Vertical interconnect 140 can be coupled to substrate inward terminal 1111 of first substrate 110 and to substrate inward terminal 1211 of second substrate 120. Optionally, adhesive 132 can be provided between second substrate 120 and electronic component 150.

FIG. 4D shows a cross-sectional view of electronic device 100 at a later stage of manufacture. In some examples, the stage of FIG. 4D can be similar stage of FIG. 2D in several aspects. In the example shown in FIG. 4D, encapsulant 130 can be provided between first substrate 110 and second substrate 120.

Figure 4E:
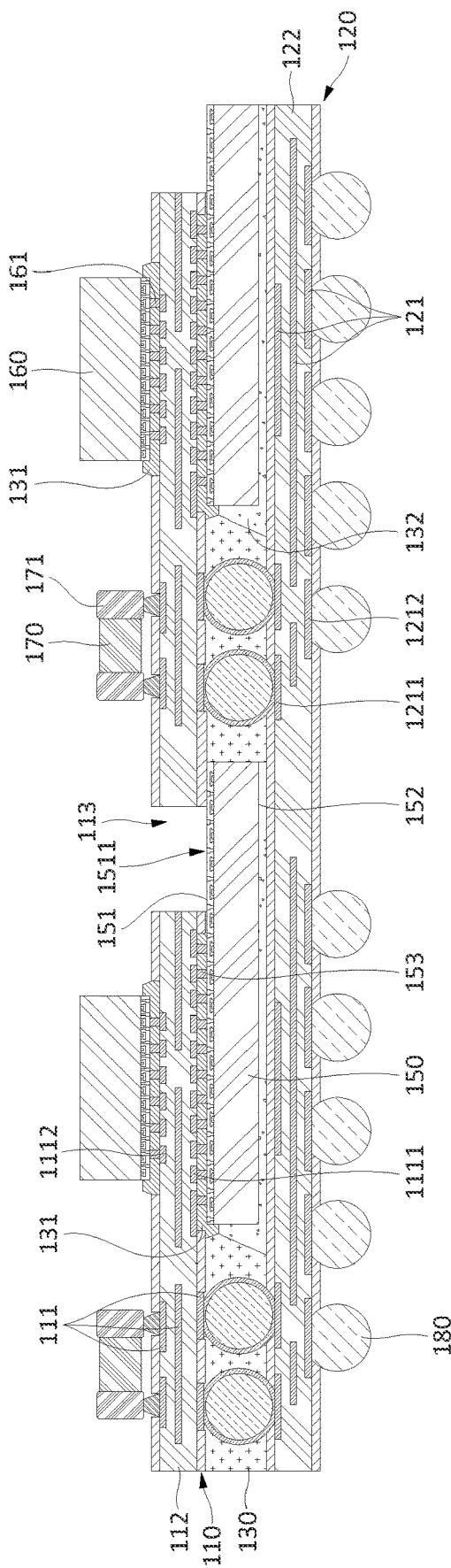

FIG. 4E shows a cross-sectional view of electronic device 100 at a later stage of manufacture. In some examples, the stage of FIG. 4E can be similar stage of FIG. 2E in several aspects. FIG. 4E shows the assembly of FIG. 4D flipped over, so first substrate 110 is positioned above and second substrate 120 is positioned below. In the example shown in FIG. 4E, electronic component 160 or electronic component 170 can be attached to first substrate 110, and external interconnect 180 can be attached to second substrate 120. Electronic components 160 or 170 can be coupled to substrate outward terminals 1112 of first substrate 110. External interconnects 180 can be coupled to substrate outward terminals 1212 of second substrate 120.

Figure 4F:
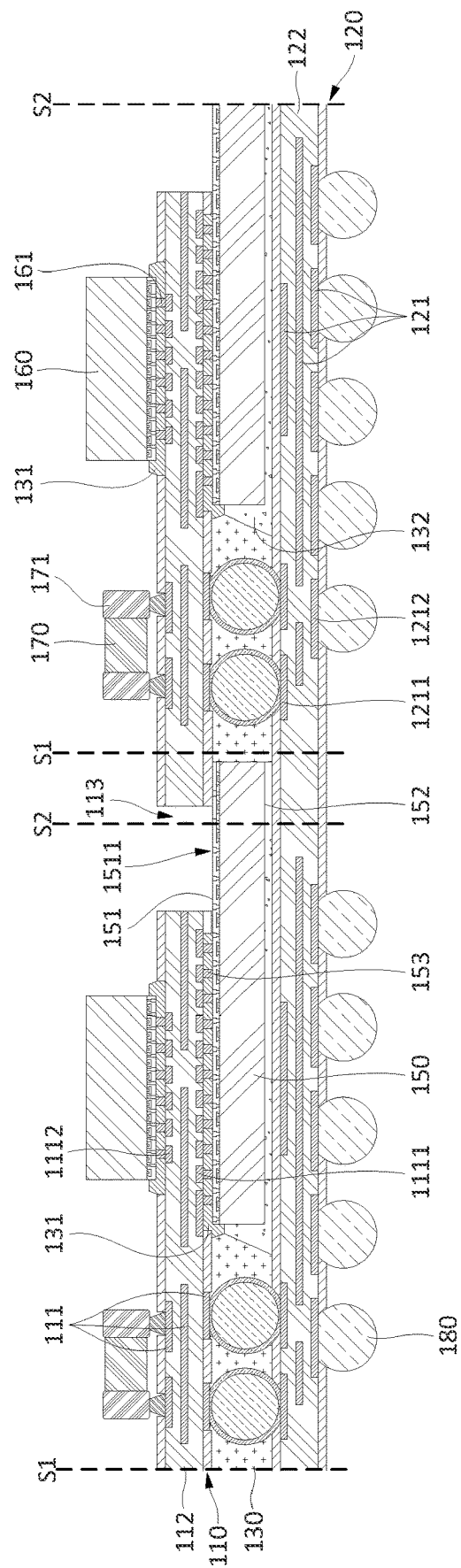

FIG. 4F shows a cross-sectional view of electronic device 100 at a later stage of manufacture. In some examples, the stage of FIG. 4F can be similar stage of FIG. 2F in several aspects. In the example shown in FIG. 4F, a singulation or sawing process is carried out through first substrate 110 and second substrate 120 to separate the assembly into separate devices, for example see the dotted lines. In some examples, the singulation tool can cut first substrate 110, encapsulant 130, second substrate 120, and electronic component 150. In some examples, the singulation tool can cut first substrate 110 across aperture 113, or adjacent one side of aperture 113. During the singulation process, one end of electronic component 150 extending across part of aperture 113 can be removed. Portions of first substrate 110 and of second substrate 120, aligned with such end of electronic component 150, can also be removed.

Figure 4G:
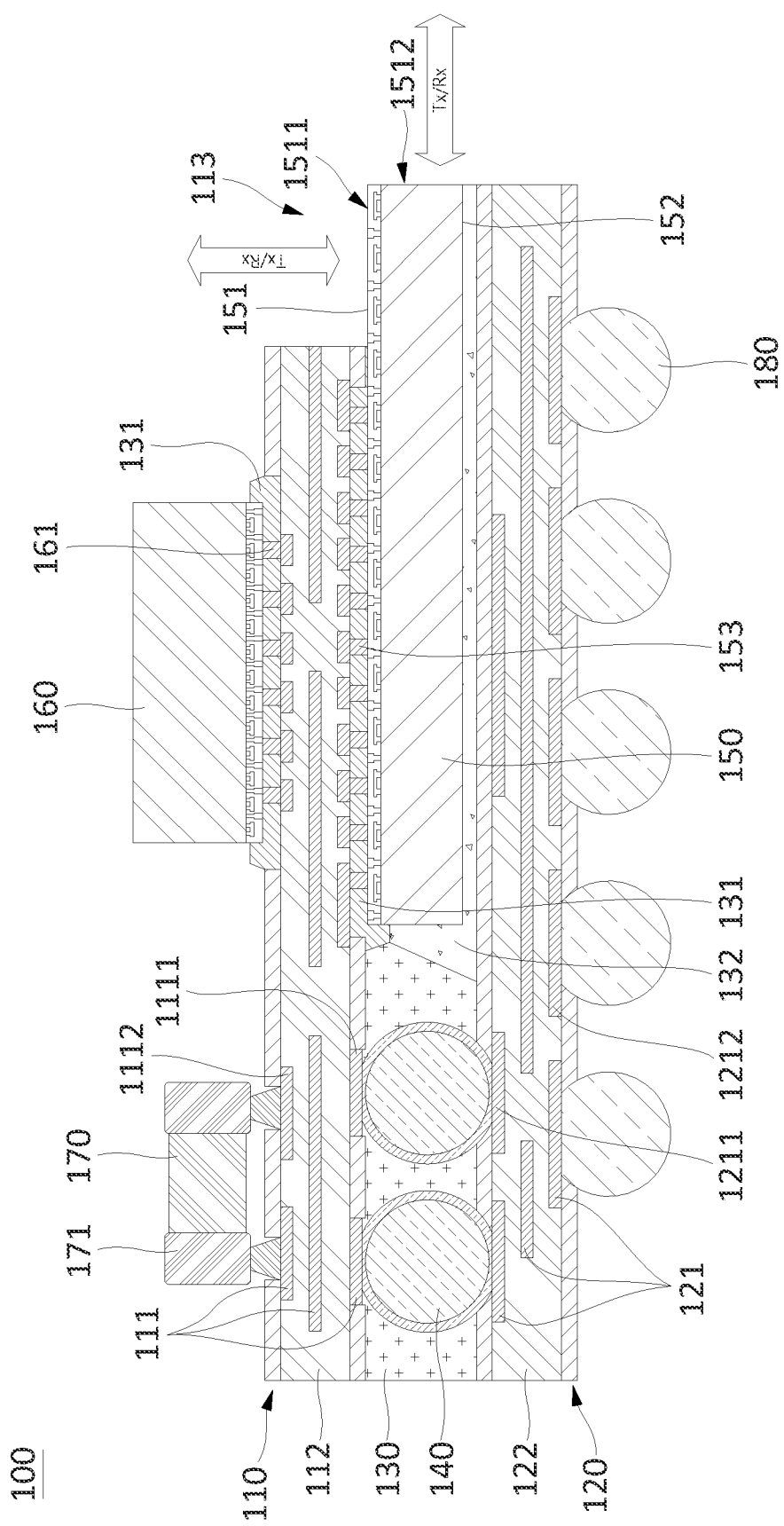

As shown in FIG. 4G, a lateral side of electronic component 150 can be exposed to comprise lateral port 1512. Electronic device 100 comprising first substrate 110, second substrate 120, encapsulant 130, vertical interconnect 140, electronic component 150, electronic component 160, and electronic component 170, and external interconnect 180, can be completed.

Figure 5:
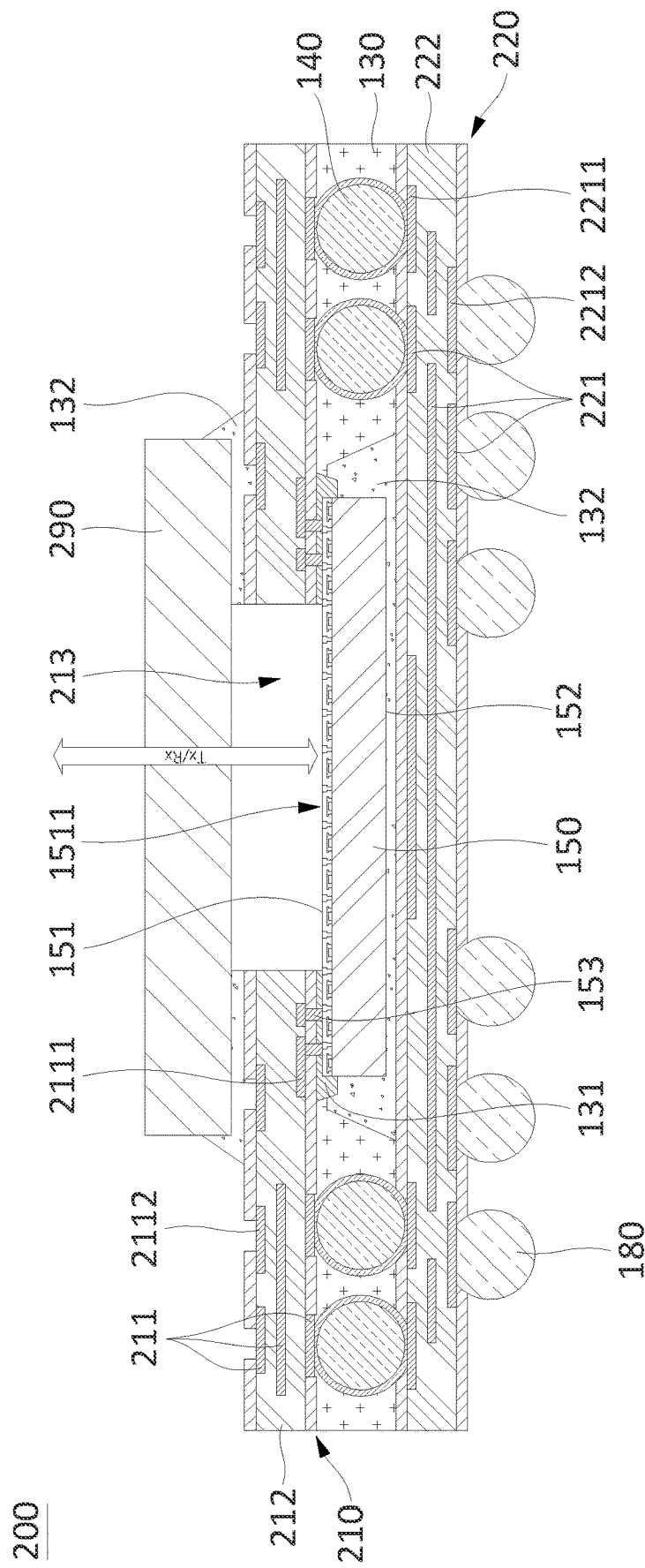
FIG. 5 shows a cross-sectional view of an example electronic device.

FIG. 5 shows a cross-sectional view of an example electronic device 200. In the example shown in FIG. 5, electronic device 200 can comprise first substrate 210, second substrate 220, encapsulant 130, vertical interconnect 140, electronic component 150, external interconnect 180, and cover 290. In some examples, electronic device 200 can comprise corresponding elements, features, materials, or formation processes similar to those described for electronic device 100, electronic device 100', electronic device 100", or electronic device 100'".

First substrate 210 can comprise conductive structure 211, dielectric structure 212, and aperture 213. Conductive structure 211 can comprise substrate inward terminal 2111 and substrate outward terminal 2112. Second substrate 220 can comprise conductive structure 221 and dielectric structure 222. Conductive structure 211 can comprise substrate inward terminal 2211 and substrate outward terminal 2212. In some examples, first substrate 210 or its elements can be similar to first substrate 110 or 110' or its corresponding elements. In some examples, cover 290 can be coupled with a first portion of substrate 210 and a second portion of substrate 210 and can be over vertical port 1511.

First substrate 210, second substrate 220, encapsulant 130, vertical interconnect 140, external interconnect 180, and cover 290 can be referred to as a semiconductor package or a package, and can provide protection for electronic component 150 from external elements or environmental exposure. The semiconductor package can provide an electrical coupling between an external component and electronic component 150.

Figure 6E:
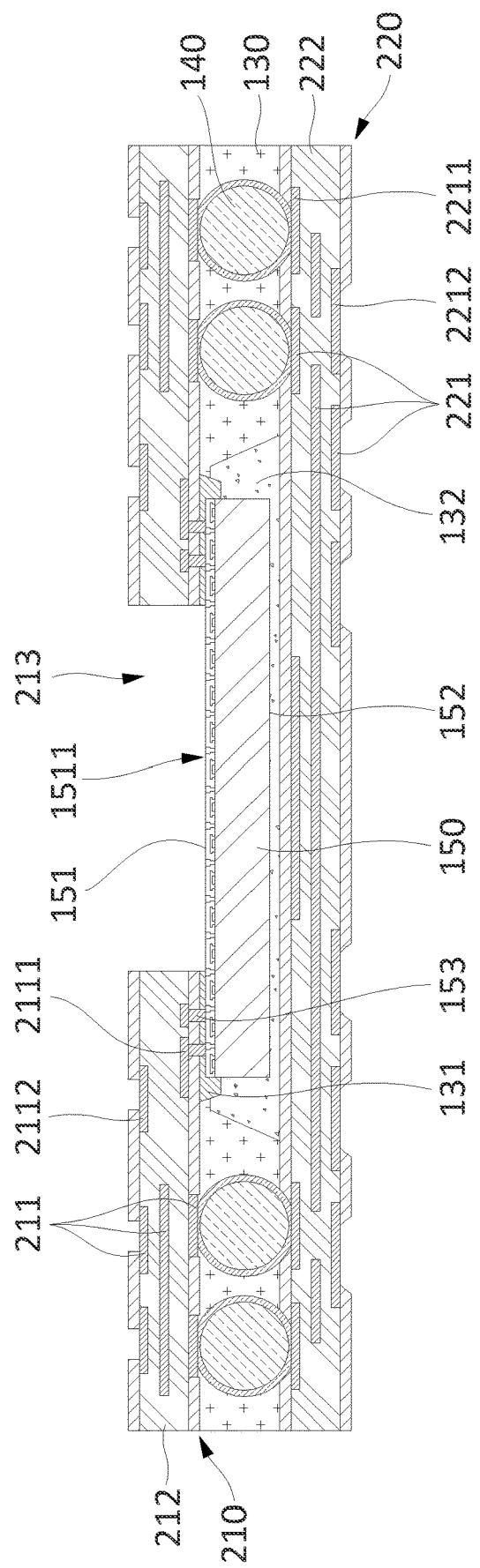

FIGS. 6A to 6G show cross-sectional views of an example method for manufacturing an example electronic device. FIG. 6A shows a cross-sectional view of electronic device 200 at an early stage of manufacture.

In the example shown in FIG. 6A, first substrate 210 comprising conductive structure 211, dielectric structure 212 and aperture 213, can be prepared. First substrate 210 can comprise or be referred to as an aperture substrate, a partial substrate, or a cavity substrate. In some examples, first substrate 210 can comprise a pre-formed substrate, a laminate substrate, or an RDL substrate. In some examples, first substrate 210 can be symmetrically formed in left and right directions of aperture 213. In some examples, first substrate 210 or its elements can be similar to first substrate 110 or 110' or its corresponding elements. For example, first substrate 210 can comprise conductive structure 211, substrate inward terminals 2111, substrate outward terminals 2112, dielectric structure 212 and aperture 213, and can be correspondingly similar to conductive structure 111, substrate inward terminals 1111, substrate outward terminals 1112, dielectric structure 112 and aperture 113 of first substrate 110.

FIG. 6B shows a cross-sectional view of electronic device 200 at a later stage of manufacture. In the example shown in FIG. 6B, electronic component 150 can be attached to a first side, for example the top side shown in FIG. 6B, of first substrate 210. Electronic component 150 can be attached to first substrate 210 to cover aperture 213. Electronic component 150 can be coupled to conductive structure 211 of first substrate 210. In some examples, a portion at component front side 151 of electronic component 150 exposed by aperture 213 can be referred to as vertical port 1511. Component terminal 153 can be coupled to substrate inward terminal 2111 of first substrate 210.

Optionally, underfill 131 can be provided between electronic component 150 and first substrate 210. Underfill 131 can be positioned between component front side 151 of electronic component 150 and the first side of first substrate 210.

FIG. 6C shows a cross-sectional view of electronic device 200 at a later stage of manufacture. In the example shown in FIG. 6C, second substrate 220 can be provided over component backside 152 of electronic component 150, and vertical interconnect 140 can electrically couple first substrate 210 and second substrate 220 to each other.

In some examples, second substrate 220 or its elements can be similar to first substrate 120 or 120' or its corresponding elements. For example, second substrate 220 can comprise conductive structure 221, substrate inward terminals 2211, substrate outward terminals 2212 and dielectric structure 222, and can be correspondingly similar to conductive structure 121, substrate inward terminals 1211, substrate outward terminals 1212 and dielectric structure 122 of second substrate 120.

Vertical interconnect 140 can be coupled to substrate inward terminal 2111 of first substrate 210 and to substrate inward terminal 2211 of second substrate 220. In some examples, vertical interconnect 140 can be attached to substrate inward terminal 2211 of second substrate 220, and then mounted on first substrate 210, and can be coupled to substrate inward terminal 2111 of first substrate 210 through a reflow process. In some examples, vertical interconnect 140 can be attached to substrate inward terminal 2111 of first substrate 210, and then second substrate 220 can be positioned over electronic component 150 and vertical interconnect 140. Then, vertical interconnect 140 can be electrically coupled to substrate inward terminal 2211 of second substrate 220 through a reflow process.

Optionally, adhesive 132 can be provided between second substrate 220 and electronic component 150. Adhesive 132 can be located between a first side of second substrate 220 and component back side 152 of electronic component 150. In some examples, adhesive 132 can protrude further than lateral sides of electronic component 150, or can extend to contact a portion of underfill 131. Adhesive 132 can serve to secure second substrate 220 to electronic component 150.

FIG. 6D shows a cross-sectional view of electronic device 200 at another stage of manufacture. In the example shown in FIG. 6D, encapsulant 130 can be provided between first substrate 210 and second substrate 220. Encapsulant 130 can encapsulate the lateral sides of electronic component 150 and vertical interconnect 140.

FIG. 6E shows a cross-sectional view of electronic device 200 at a later stage of manufacture. FIG. 6E shows the assembly of FIG. 6D flipped over, so first substrate 210 is positioned above and second substrate 220 is positioned below. Vertical port 1511 of electronic component 150 can be exposed upward by aperture 213 of first substrate 210.

Figure 6F:
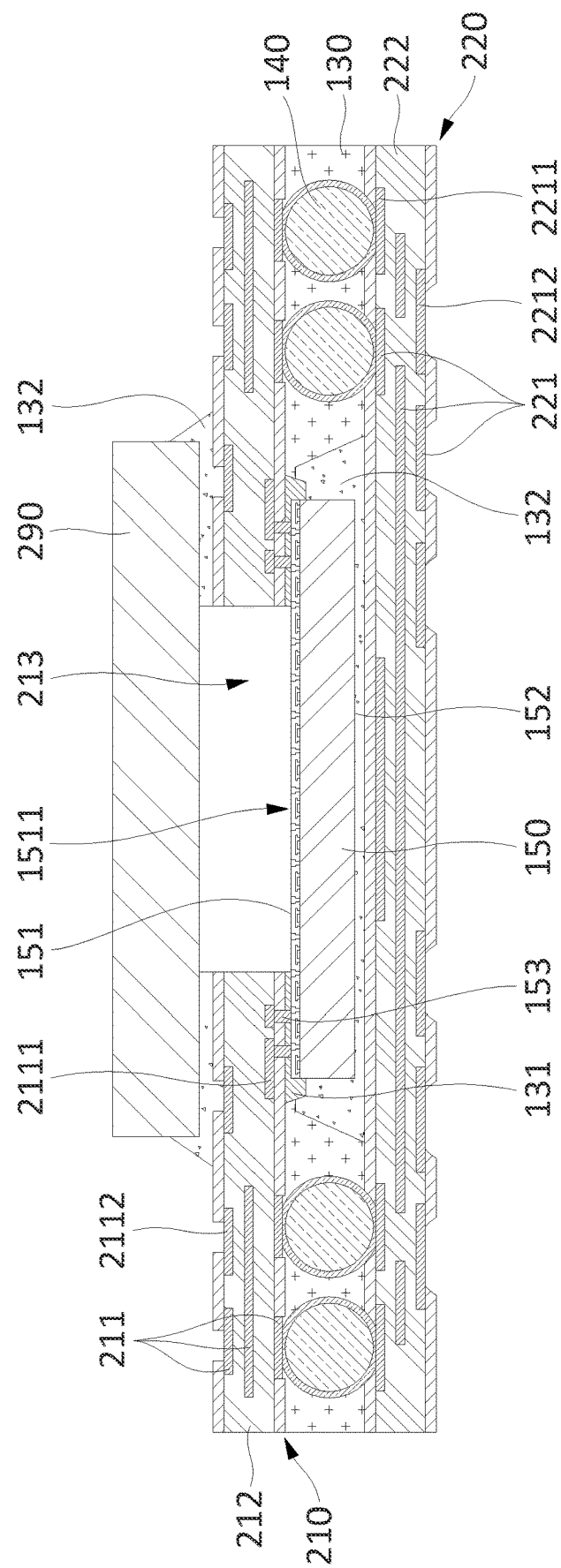

FIG. 6F shows a cross-sectional view of electronic device 200 at a later stage of manufacture. In the example shown in FIG. 6F, cover 290 can be attached to first substrate 210 to cover aperture 213 of first substrate 210. In some examples, cover 290 can be wider than aperture 213. Cover 290 can comprise a transparent or translucent material to permit light or signals to pass through. In some examples, cover 290 can comprise glass. In some examples, cover 290 can permit transmission of an optical signal generated from electronic component 150, or can permit an optical signal generated externally to be received at electronic component 150. Cover 290 can provide protection for vertical port 1511 from external elements or environmental exposure. In some examples, cover 290 can have a thickness in a range of about 30 μm to about 500 μm.

In some examples cover 290 can be attached to first substrate 210 through adhesive 132. Adhesive 132 can be positioned between cover 290 and first substrate 210. Adhesive 132 can extend to lateral sides of cover 290. In some examples, adhesive 132 can be coated on the second side of first substrate 210, and cover 290 can be mounted on first substrate 210, followed by curing adhesive 132, and attaching cover 290 to first substrate 210.

Figure 6G:
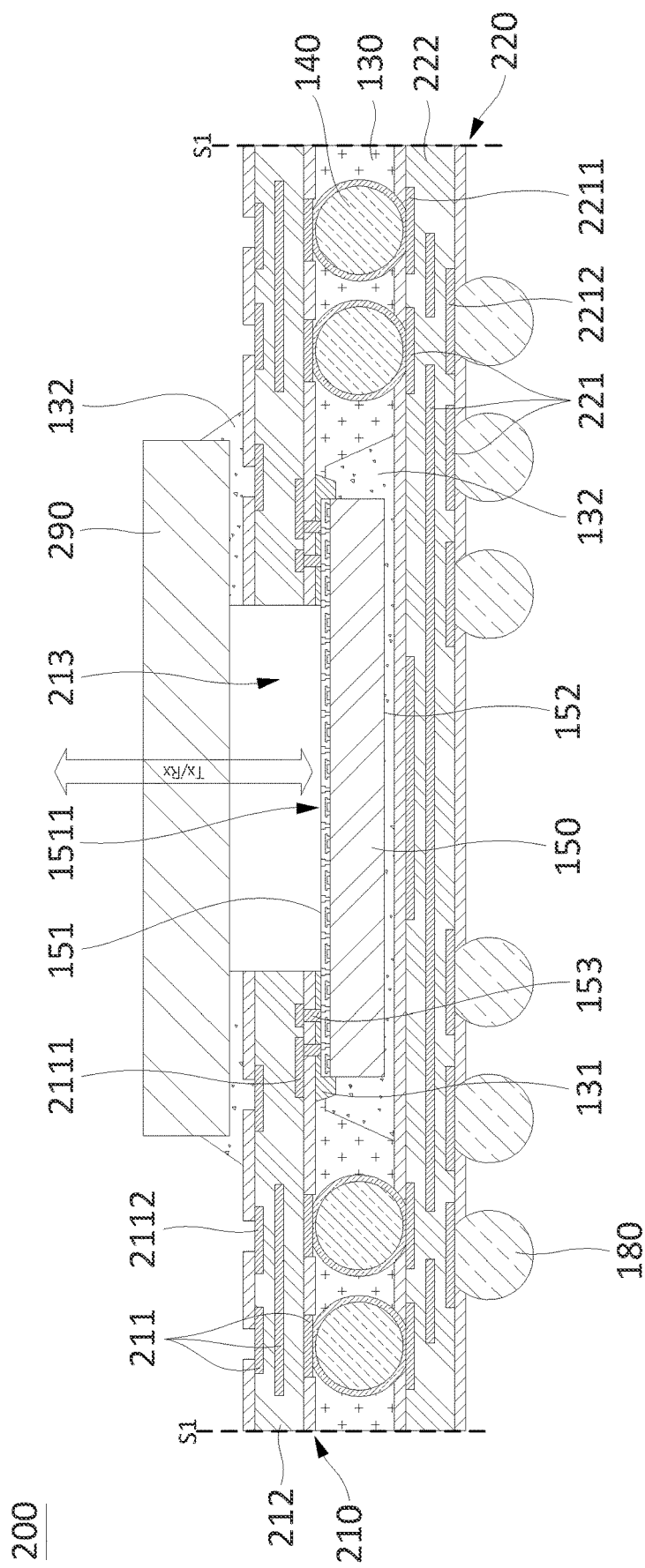

FIG. 6G shows a cross-sectional view of electronic device 200 at a later stage of manufacture. In the example shown in FIG. 6G, external interconnect 180 can be attached to second substrate 220. External interconnect 180 can be electrically coupled to substrate outward terminal 2212 of second substrate 220. In some examples, external interconnect 180 can be electrically coupled to vertical interconnect 140 through conductive structure 221. External interconnect 180 can provide an electrical path between second substrate 220 and an external component. First substrate 210, encapsulant 130 and second substrate 220 can be singulated along lines S1 to complete individual electronic device 200.

Figure 7:
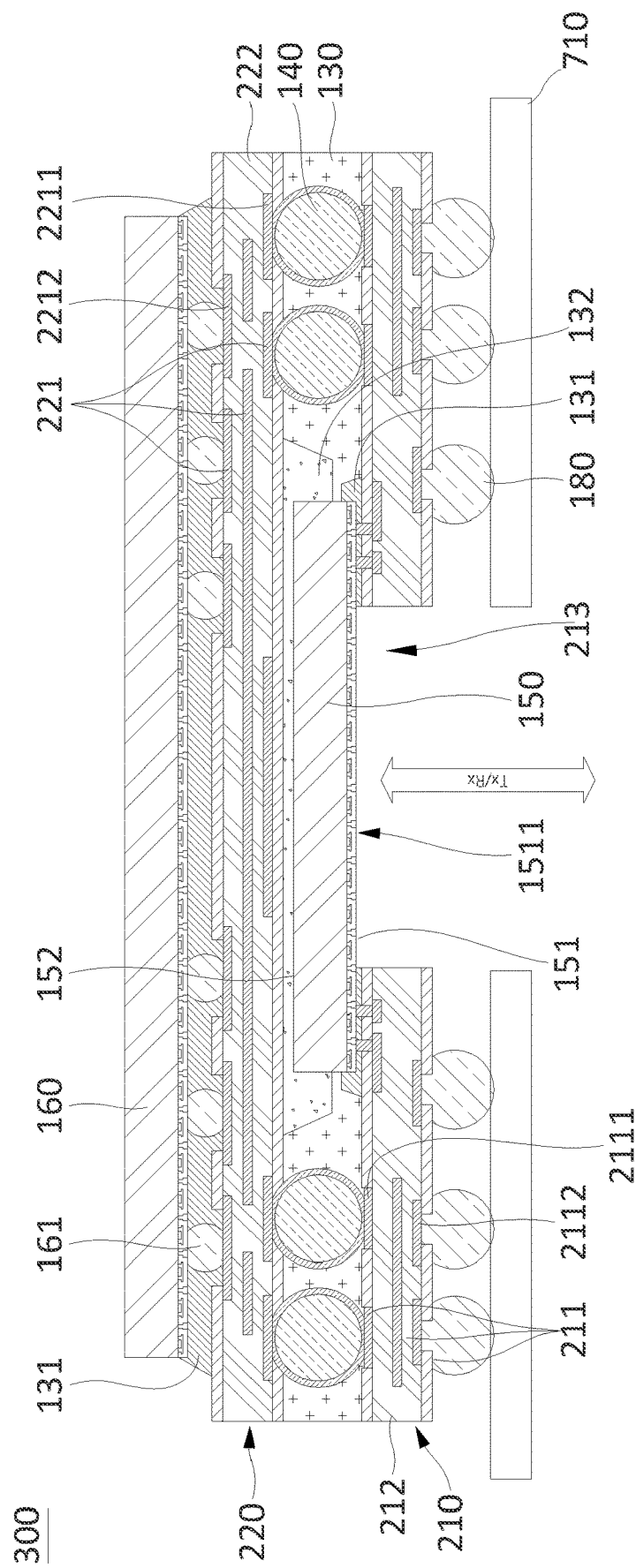
FIG. 7 shows a cross-sectional view of an example electronic device.

FIG. 7 shows a cross-sectional view of an example electronic device 300. In the example shown in FIG. 7, electronic device 300 can comprise first substrate 210, second substrate 220, encapsulant 130, vertical interconnect 140, electronic component 150, external interconnect 180, and electronic component 160 (optional). In some examples, electronic device 200 can comprise corresponding elements, features, materials, or formation processes similar to those described for electronic device 100, electronic device 100', electronic device 100", electronic device 100''', or electronic device 200.

First substrate 210 can comprise conductive structure 211, dielectric structure 212, and aperture 213. Conductive structure 211 can comprise substrate inward terminal 2111 and substrate outward terminal 2112. Second substrate 220 can comprise conductive structure 221 and dielectric structure 222. Conductive structure 211 can comprise substrate inward terminal 2211 and substrate outward terminal 2212. In some examples, first substrate 210 or its elements can be similar to first substrate 110 or 110' or its corresponding elements. In some examples, electronic component 160 can be coupled with substrate 220, and substrate 220 can be between electronic component 150 and electronic component 160.

First substrate 210, second substrate 220, encapsulant 130, vertical interconnect 140, and external interconnect 180 can be referred to as a semiconductor package or a package, and can provide protection for electronic component 150 from external elements or environmental exposure. The semiconductor package can provide an electrical coupling between an external component and electronic component 150, or between electronic components 150 and 160.

Electronic device 300 can be an alternate configuration of electronic device 200. For example, in electronic device 300, first substrate 210, second substrate 220, and electronic component 150 are inverted or flipped from their configuration in electronic device 200 (FIG. 5). Accordingly, in electronic device 300, aperture 213 and vertical port 1511 are exposed or positioned downwardly, in opposite direction with respect to electronic device 200 (FIG. 5), where they are exposed or positioned upwardly. Further, in electronic device 300, external interconnect 180 is coupled to substrate outward terminals 2112 of substrate 210. In some examples electronic device 300 can be coupled to external substrate 710 via external interconnects 180, where external substrate 710 can comprise an aperture aligned with vertical port 1511. External substrate 710 can comprise a motherboard or a printed circuit board in some implementations.

In some examples, electronic device 300 can comprise electronic component 160 coupled via component terminals 161 to substrate outward terminals 2212 of second substrate 220. Underfill 131 can optionally be provided between electronic component 161 and second substrate 220. In some examples, an encapsulant similar to encapsulant 130 can be provided to cover electronic component 160 over second substrate 220.

The present disclosure includes reference to certain examples. It will be understood by those skilled in the art, however, that various changes may be made and equivalents may be substituted without departing from the scope of the disclosure. In addition, modifications may be made to the disclosed examples without departing from the scope of the present disclosure. Therefore, it is intended that the present disclosure is not limited to the examples disclosed, but that the disclosure will include all examples falling within the scope of the appended claims.

The invention claimed is:

1. An electronic device, comprising:
   a first substrate comprising a first conductive structure;
   a first electronic component coupled to a bottom side of the first substrate;
   a vertical interconnect coupled to the bottom side of the first substrate and located external to the first electronic component; and
   an encapsulant covering the vertical interconnect, a first lateral side of the first electronic component, and at least a portion of the bottom side of the first substrate;
   wherein a vertical port on the first electronic component is exposed by an aperture of the first substrate.

2. The electronic device of claim 1, comprising:
   a second electronic device coupled to a top side of the first substrate.

3. The electronic device of claim 2, wherein:
   a lateral port at a second lateral side of the first electronic component is exposed from the encapsulant.

4. The electronic device of claim 1, comprising:
   a cover coupled over the aperture of the first substrate.

5. The electronic device of claim 4, comprising:
   a second substrate coupled to the vertical interconnect:
   wherein the first electronic component and the encapsulant are located between the first substrate and the second substrate; and
   wherein the cover comprises at least one of a transparent material or a translucent material.

6. The electronic device of claim 1, comprising:
   a second substrate coupled to the vertical interconnect;

wherein the first electronic component and the encapsulant are located between the first substrate and the second substrate.

7. The electronic device of claim 6, comprising:
a second electronic component coupled to the second substrate;
wherein the second substrate is located between the first electronic component and the second electronic component.

8. The electronic device of claim 6, comprising:
an adhesive between the second substrate and the first electronic component.

9. The electronic device of claim 1, wherein:
the aperture is defined by a first portion of the first substrate and a second portion of the first substrate; and
the first portion of the first substrate and the second portion of the first substrate are located over a footprint of the first electronic component.

10. An electronic device, comprising:
a first substrate comprising a first conductive structure;
a second substrate comprising a second conductive structure;
a vertical interconnect coupled with the first conductive structure and the second conductive structure;
an encapsulant between the first substrate and the second substrate and covering the vertical interconnect; and
a first electronic component between the first substrate and the second substrate, wherein the first electronic component has a first component terminal on a front side of the first electronic component and coupled with the first conductive structure;
wherein a lateral port at a lateral side of the first electronic component is exposed;
wherein the lateral side of the first electronic component is coplanar with an end of the second substrate; and
wherein a top side of the first electronic component and the lateral side of the first electronic component are free of the encapsulant.

11. The electronic device of claim 10, comprising:
a second electronic component over the first substrate;
wherein the second electronic component has a second component terminal coupled with the first conductive structure.

12. The electronic device of claim 11, wherein:
the first component terminal is coupled to an inward terminal of the first conductive structure; and
the second component terminal is coupled to an outward terminal of the first conductive structure.

13. The electronic device of claim 10, wherein:
a vertical port at the front side of the first electronic component is exposed by an aperture of the first substrate.

14. The electronic device of claim 10, comprising:
an adhesive between the first electronic component and the second substrate.

15. The electronic device of claim 14, wherein:
the adhesive contacts a lateral side of the first electronic component.

16. A method to manufacture an electronic device, comprising:
providing a first substrate comprising a first conductive structure;
providing a first electronic component coupled to a bottom side of the first substrate;
providing a vertical interconnect coupled to the bottom side of the first substrate and located external to the first electronic component; and
providing an encapsulant covering the vertical interconnect, a first lateral side of the first electronic component, and at least a portion of the bottom side of the first substrate;
wherein a vertical port on the first electronic component is exposed by an aperture of the first substrate.

17. The method of claim 16, comprising:
providing a second electronic device coupled to a top side of the first substrate.

18. The method of claim 17, wherein:
a lateral port at a second lateral side of the first electronic component is exposed from the encapsulant.

19. The method of claim 16, comprising:
providing a cover coupled over the aperture of the first substrate.

20. The method of claim 19, comprising:
providing a second substrate coupled to the vertical interconnect:
wherein the first electronic component and the encapsulant are located between the first substrate and the second substrate; and
wherein the cover comprises at least one of a transparent material or a translucent material.

* * * * *